US012635089B2

(12) United States Patent
Seo

(10) Patent No.: US 12,635,089 B2
(45) Date of Patent: May 19, 2026

(54) DISPLAY DEVICE

(71) Applicant: Samsung Display Co., LTD., Yongin-si (KR)

(72) Inventor: Taean Seo, Yongin-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 113 days.

(21) Appl. No.: 18/793,050

(22) Filed: Aug. 2, 2024

(65) Prior Publication Data

US 2025/0176119 A1 May 29, 2025

(30) Foreign Application Priority Data

Nov. 28, 2023 (KR) ........................ 10-2023-0167780

(51) Int. Cl.
H05K 5/02 (2006.01)

(52) U.S. Cl.
CPC .................................. H05K 5/0217 (2013.01)

(58) Field of Classification Search
CPC ........................... H05K 5/0217; H05K 5/0017
USPC ........................................ 361/807, 809, 810
See application file for complete search history.

(56) References Cited

U.S. PATENT DOCUMENTS

| | | | |
|---|---|---|---|
| 11,409,337 B2 | 8/2022 | Kang et al. | |
| 2019/0305237 A1* | 10/2019 | Shin | G06F 3/0488 |
| 2022/0236767 A1* | 7/2022 | Zhang | G06F 1/1681 |
| 2022/0346252 A1* | 10/2022 | Seo | G09F 9/301 |
| 2023/0038719 A1 | 2/2023 | Hyun et al. | |
| 2023/0269890 A1* | 8/2023 | Choi | H05K 5/0217 |
| | | | 361/807 |

FOREIGN PATENT DOCUMENTS

| | | | | |
|---|---|---|---|---|
| KR | 102187746 B1 | 12/2020 | | |
| KR | 1020210024341 A | 3/2021 | | |
| KR | 1020230022783 A | 2/2023 | | |
| WO | WO-2021258613 A1 * | 12/2021 | ............. | G09F 9/302 |

* cited by examiner

*Primary Examiner* — Hung S. Bui
(74) *Attorney, Agent, or Firm* — CANTOR COLBURN LLP

(57) ABSTRACT
A display device includes a display module, a support plate that is disposed on a lower surface of the display module and that includes a flat part and a flexible part that extends from the flat part in a first direction and that is folded about a bending axis that extends in a second direction crossing the first direction, a support bar that is disposed on a lower surface of the flexible part and that extends in the second direction, an upper connecting part that extends from an upper surface of the flexible part into the support bar through the flexible part, and a lower connecting part that extends from a lower surface of the support bar into the flexible part through the support bar.

20 Claims, 28 Drawing Sheets

FIG. 3

DISPLAY DEVICE

This application claims priority to Korean Patent Application No. 10-2023-0167780, filed on Nov. 28, 2023, and all the benefits accruing therefrom under 35 U.S.C. § 119, the content of which in its entirety is herein incorporated by reference.

BACKGROUND

1. Field

The invention relates to a display device.

2. Description of Related Art

In general, an electronic device, such as a smart phone, a digital camera, a notebook computer, a car navigation unit, a smart television, or the like, which provides an image to a user includes a display device for displaying an image. The display device generates an image and provides the generated image to the user through a display screen.

With the development of display device technology, various types of display devices are being developed. For example, a flexible display device that is slidable or rollable to extend outside a case is being developed. The flexible display device that is able to be deformed in various ways may be easy to carry and may improve user convenience.

The flexible display device includes a flexible display module. The display module is accommodated in the case and is extended by being withdrawn from the case to the outside as needed. A support part for supporting the display module is disposed under the display module.

SUMMARY

Embodiments of the invention provide a display device including support bars and a support plate which are more firmly coupled with each other.

According to an embodiment, a display device includes a display module, a support plate that is disposed on a lower surface of the display module and that includes a flat part and a flexible part that extends from the flat part in a first direction and that is folded about a bending axis that extends in a second direction crossing the first direction, a support bar that is disposed on a lower surface of the flexible part and that extends in the second direction, an upper connecting part that extends from an upper surface of the flexible part into the support bar through the flexible part, and a lower connecting part that extends from a lower surface of the support bar into the flexible part through the support bar.

According to an embodiment, a display device includes a display module including a display region and a non-display region disposed around the display region, a support plate that is disposed on a lower surface of the display module and that includes a flat part and a flexible part that extends from the flat part, a support bar disposed on a lower surface of the flexible part, an upper connecting part that extends from an upper surface of the flexible part into the support bar through the flexible part and overlaps the non-display region when viewed from above a plane, and a lower connecting part that extends from a lower surface of the support bar into the flexible part through the support bar and overlaps the display region when viewed from above the plane.

According to an embodiment, a display device includes a display module, a support plate that is disposed on a lower surface of the display module and that includes a flat part and a flexible part that extends from the flat part, a support bar disposed on a lower surface of the flexible part, an upper connecting part that extends from an upper surface of the flexible part into the support bar through the flexible part, a lower connecting part that extends from a lower surface of the support bar into the flexible part through the support bar, and an adhesive layer disposed in a depression defined on an upper surface of the support bar between the upper connecting part and the lower connecting part.

BRIEF DESCRIPTION OF THE FIGURES

The above and other objects and features of the invention will become apparent by describing in detail embodiments thereof with reference to the accompanying drawings.

FIG. 3 is a view illustrating an extended state of the display device illustrated in FIG. 1, according to an embodiment.

DETAILED DESCRIPTION

Figure 1:
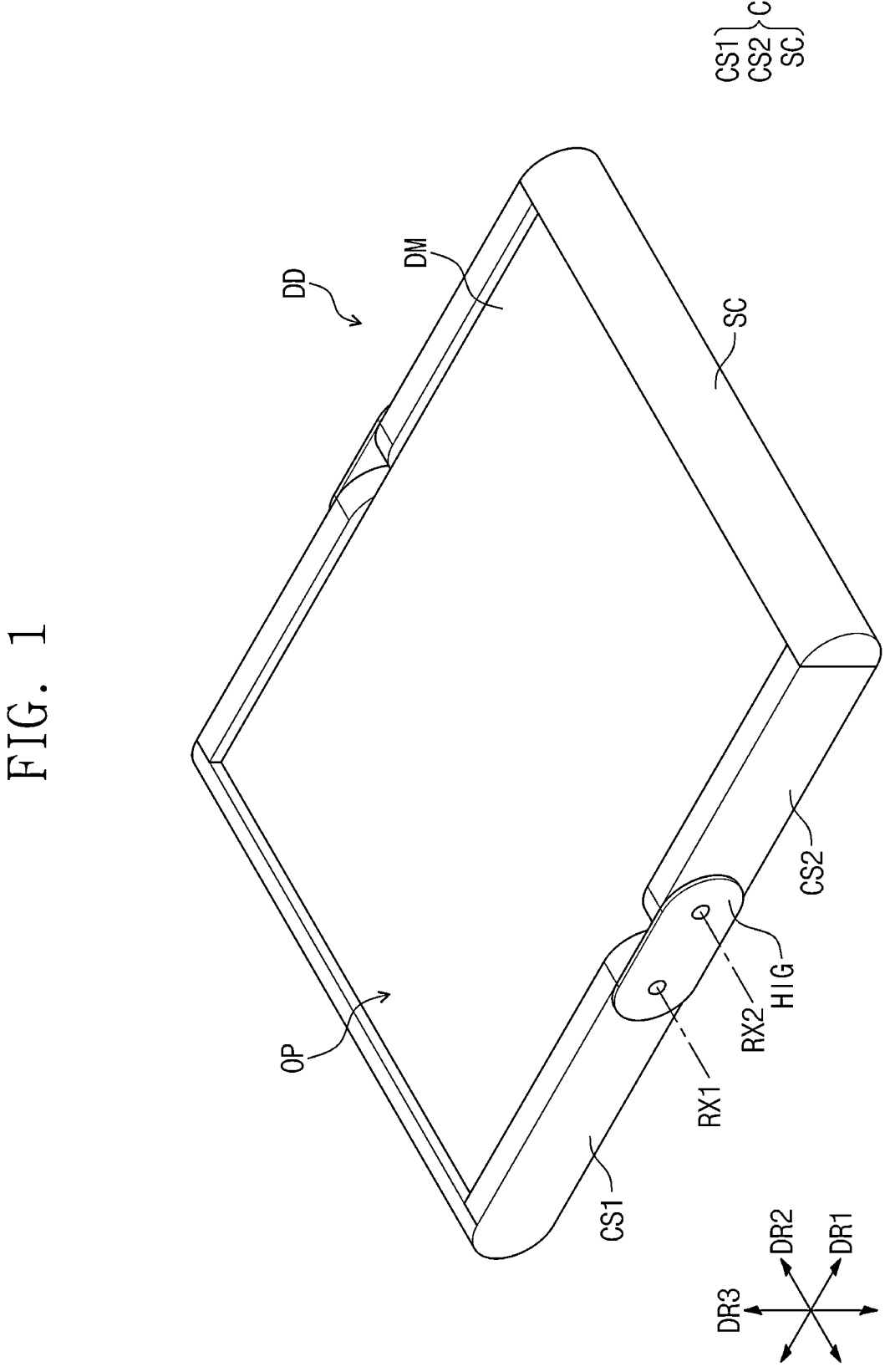
FIG. 1 is a perspective view of a display device, according to an embodiment.

In this specification, when it is mentioned that a component (or, an area, a layer, a part, etc.) is referred to as being "on", "connected to" or "coupled to" another component, this means that the component may be disposed directly on, connected to, or coupled to the other component or a third component may be present therebetween.

Identical reference numerals refer to identical components. Additionally, in the drawings, the thicknesses, proportions, and dimensions of components are exaggerated for effective description.

As used herein, the term "and/or" includes all of one or more combinations defined by related components.

Terms such as first, second, and the like may be used to describe various components, but the components should not be limited by the terms. The terms may be used only for distinguishing one component from other components. For example, without departing the scope of the invention, a first component may be referred to as a second component, and similarly, the second component may also be referred to as the first component. The terms of a singular form may include plural forms unless otherwise specified.

In addition, terms such as "below", "under", "above", and "over" are used to describe a relationship of components illustrated in the drawings. The terms are relative concepts and are described based on directions illustrated in the drawing.

Unless otherwise defined, all terms used herein, including technical or scientific terms, have the same meanings as those generally understood by those skilled in the art to which the invention pertains. Such terms as those defined in a generally used dictionary are to be interpreted as having meanings equal to the contextual meanings in the relevant field of art, and are not to be interpreted as having ideal or excessively formal meanings unless clearly defined as having such in the present application.

It should be understood that terms such as "comprise", "include", and "have", when used herein, specify the presence of stated features, numbers, steps, operations, components, parts, or combinations thereof, but do not preclude the presence or addition of one or more other features, numbers, steps, operations, components, parts, or combinations thereof.

Hereinafter, embodiments of the invention will be described with reference to the accompanying drawings.

FIG. 1 is a perspective view of a display device according to an embodiment of the present disclosure.

In an embodiment and referring to FIG. 1, the display device DD may have a rectangular shape with long sides extending in a first direction DR1 and short sides extending in a second direction DR2 crossing the first direction DR1. However, the shape of the display device DD is not limited thereto.

Hereinafter, the direction crossing the first direction DR1 is defined as the second direction DR2. A direction substantially perpendicular to a plane defined by the first and second directions DR1 and DR2 is defined as a third direction DR3. As used herein, the expression "when viewed from above the plane" may mean that it is viewed in the third direction DR3.

In an embodiment, the display device DD may include a display module DM, a case CS that accommodates the display module DM, and hinges HIG coupled to the case CS. The display module DM may be exposed to the outside through an opening OP defined in an upper portion of the case CS. The display module DM may be a flexible display module.

In an embodiment, the case CS may include a first case CS1, a second case CS2, and a sliding case SC. The first case CS1, the second case CS2, and the sliding case SC may be coupled together and may accommodate the display module DM. The first case CS1 and the second case CS2 may be coupled with each other in the first direction DR1.

In an embodiment, the sliding case SC may be coupled to the second case CS2. For example, the sliding case SC may be coupled to an opposite side of the second case CS2 opposite to the side of the second case CS2 that is disposed adjacent to the first case CS1. The sliding case SC may be coupled to the opposite side of the second case CS2 that extends in the second direction DR2. The sliding case SC may define one side of the display device DD.

In an embodiment, the hinges HIG may be coupled to the first case CS1 and the second case CS2. The hinges HIG may be coupled to opposite sides of the first case CS1 opposite to each other in the second direction DR2 and opposite sides of the second case CS2 opposite to each other in the second direction DR2. The hinges HIG may be disposed adjacent to one side of the first case CS1 and one side of the second case CS2 that face each other in the first direction DR1.

In an embodiment, the hinges HIG may define a first rotational axis RX1 and a second rotational axis RX2 that extend in the second direction DR2 and that are spaced apart from each other in the first direction DR1. The first rotational axis RX1 may be disposed adjacent to the one side of the first case CS1, and the second rotational axis RX2 may be adjacent to the one side of the second case CS2.

Figure 2:
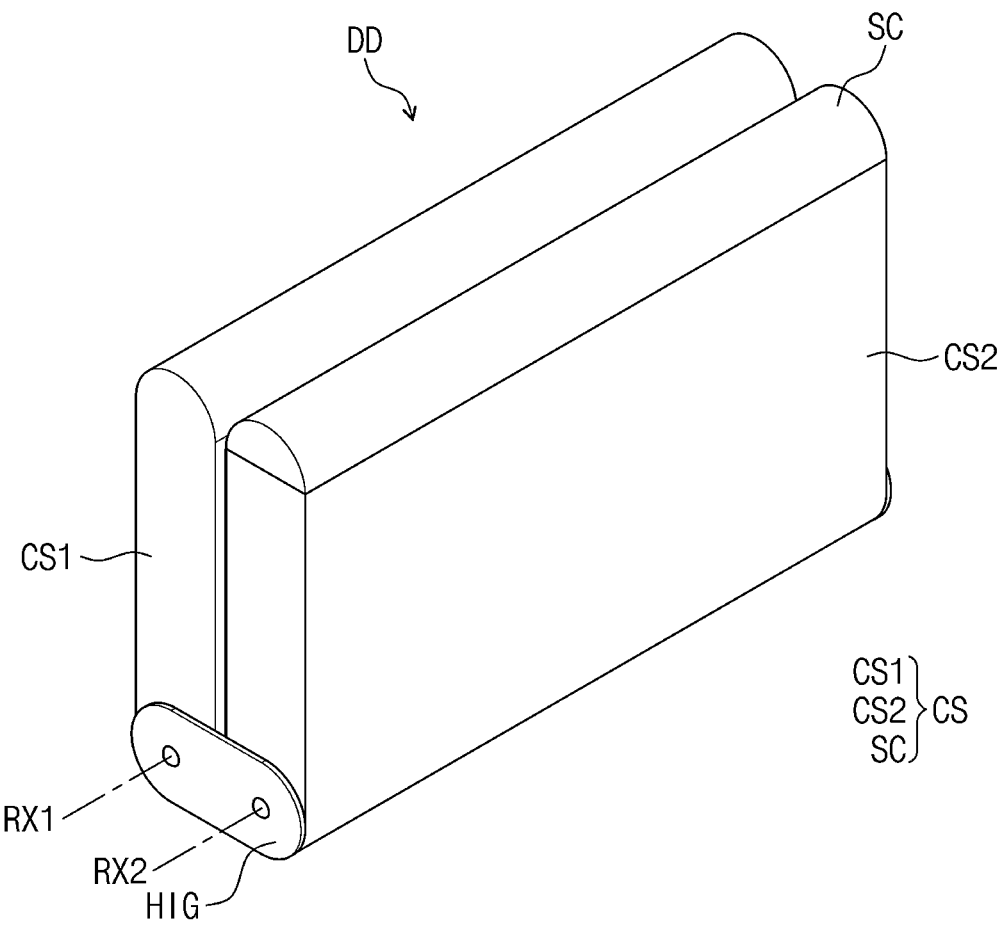
FIG. 2 is a view illustrating a folded state of the display device illustrated in FIG. 1, according to an embodiment.
Figure 2:
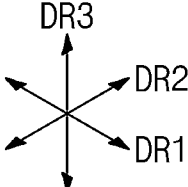

FIG. 2 is a view illustrating a folded state of the display device illustrated in FIG. 1, according to an embodiment.

In an embodiment and referring to FIGS. 1 and 2, the first case CS1 and the second case CS2 may be coupled to the hinges HIG so as to rotate. For example, the first case CS1 may be coupled to the hinges HIG so as to rotate about the first rotational axis RX1, and the second case CS2 may be coupled to the hinges HIG so as to rotate about the second rotational axis RX2.

In an embodiment, the display device DD may be changed from the unfolded state illustrated in FIG. 1 to the folded state illustrated in FIG. 2. For example, the first case CS1 and the second case CS2 may rotate about the first rotational axis RX1 and the second rotational axis RX2, respectively, and the display device DD may be folded accordingly.

In an embodiment, the first case CS1 may rotate about the first rotational axis RX1 in the clockwise direction, and the second case CS2 may rotate about the second rotational axis RX2 in the counterclockwise direction. As the first case CS1 and the second case CS2 rotate, the display module DM may be folded. In the folded state of the display device DD, the display module DM may not be exposed to the outside.

In an embodiment, the display device DD may be changed from the folded state illustrated in FIG. 2 to the unfolded state illustrated in FIG. 1. For example, the first case CS1 may rotate about the first rotational axis RX1 in the counterclockwise direction, and the second case CS2 may rotate about the second rotational axis RX2 in the clockwise direction. Accordingly, the display device DD may be unfolded.

Figure 3:
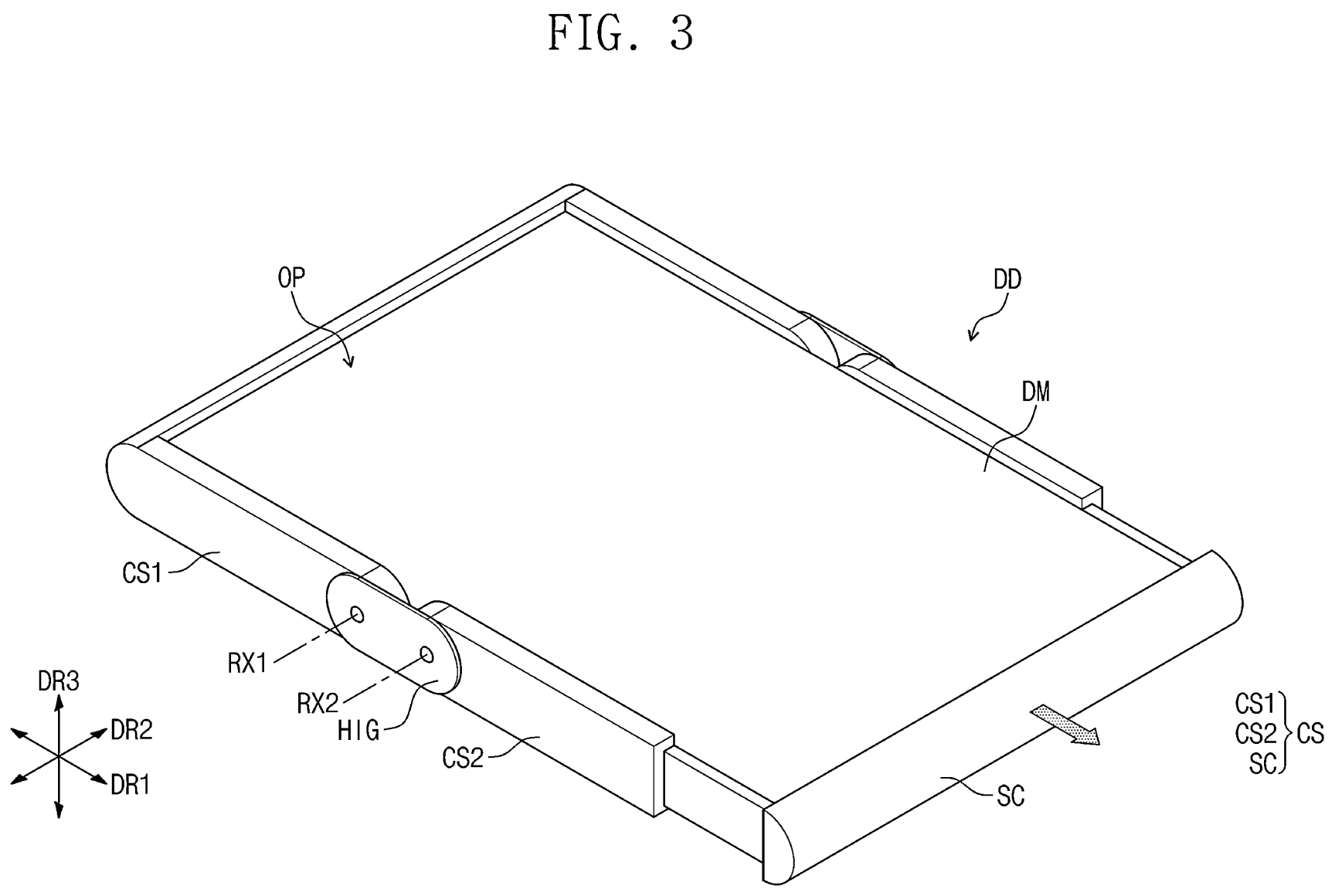

FIG. 3 is a view illustrating an extended state of the display device illustrated in FIG. 1, according to an embodiment.

In an embodiment and referring to FIGS. 1 and 3, the sliding case SC may be coupled to the second case CS2 so as to slide relative to the second case CS2 in the first direction DR1. The sliding case SC may move toward or away from the second case CS2 in the first direction DR1. The structure of the sliding case SC will be described below in detail with reference to FIG. 28.

In an embodiment, in the unfolded state, the area of an exposed surface of the display module DM may be adjusted depending on the movement of the sliding case SC. When the sliding case SC moves away from the second case CS2 in the first direction DR1 as illustrated in FIG. 3, the area of the exposed surface of the display module DM may be expanded. When the sliding case SC moves toward the second case CS2 in the first direction DR1, the area of the exposed surface of the display module DM may be reduced as illustrated in FIG. 1.

In an embodiment, the state of the display device DD illustrated in FIG. 1 may be defined as a default mode, and the state of the display device DD illustrated in FIG. 3 may be defined as an extended mode. Although not illustrated, a portion of the display module DM may be folded and accommodated within the sliding case SC and, as illustrated in FIG. 3, may be pulled out as needed. This structure will be described below in detail.

Figure 4:
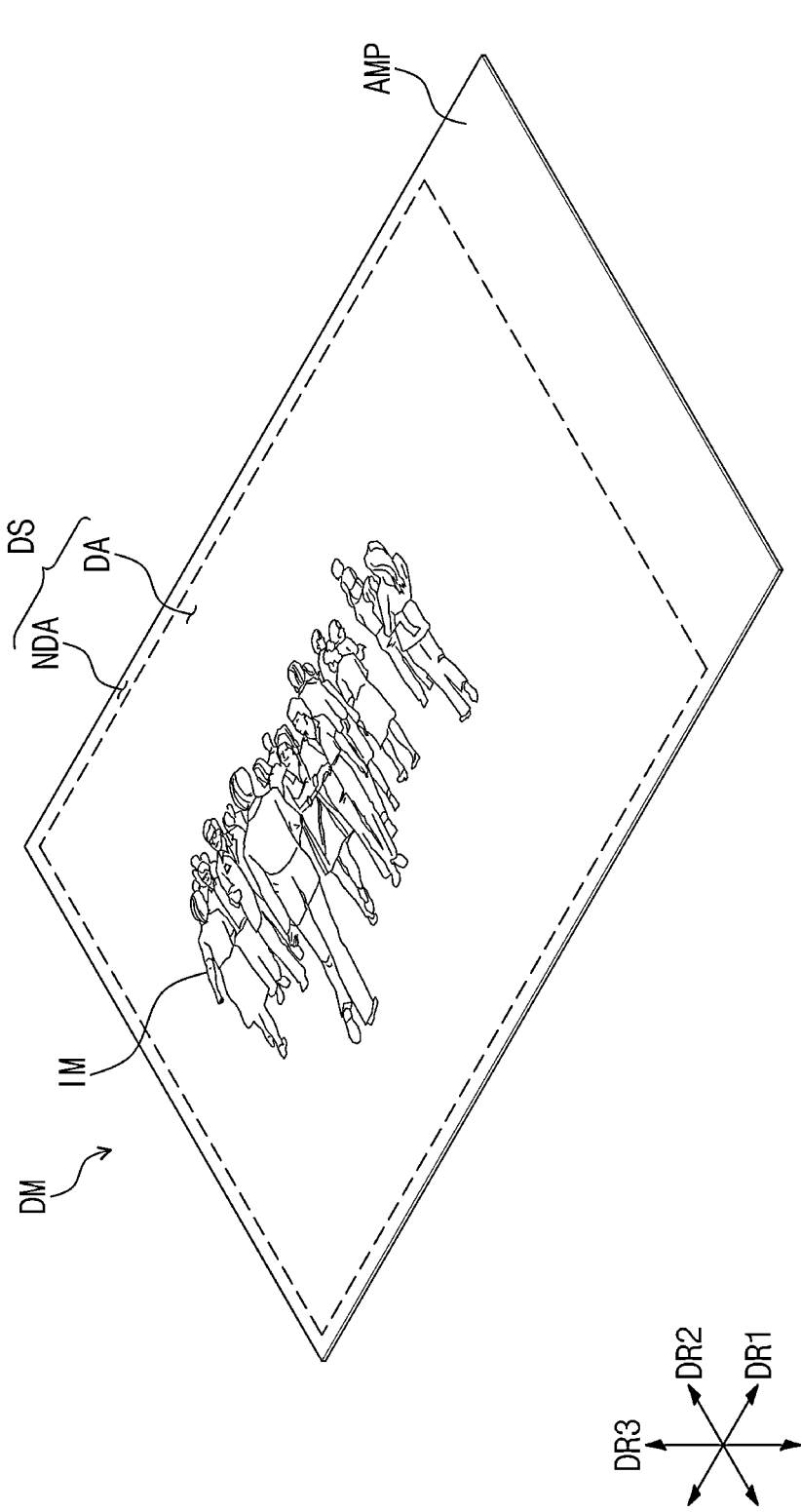
FIG. 4 is a perspective view illustrating an unfolded state of a display module accommodated in a case illustrated in FIGS. 1 to 3, according to an embodiment.
Figure 5:
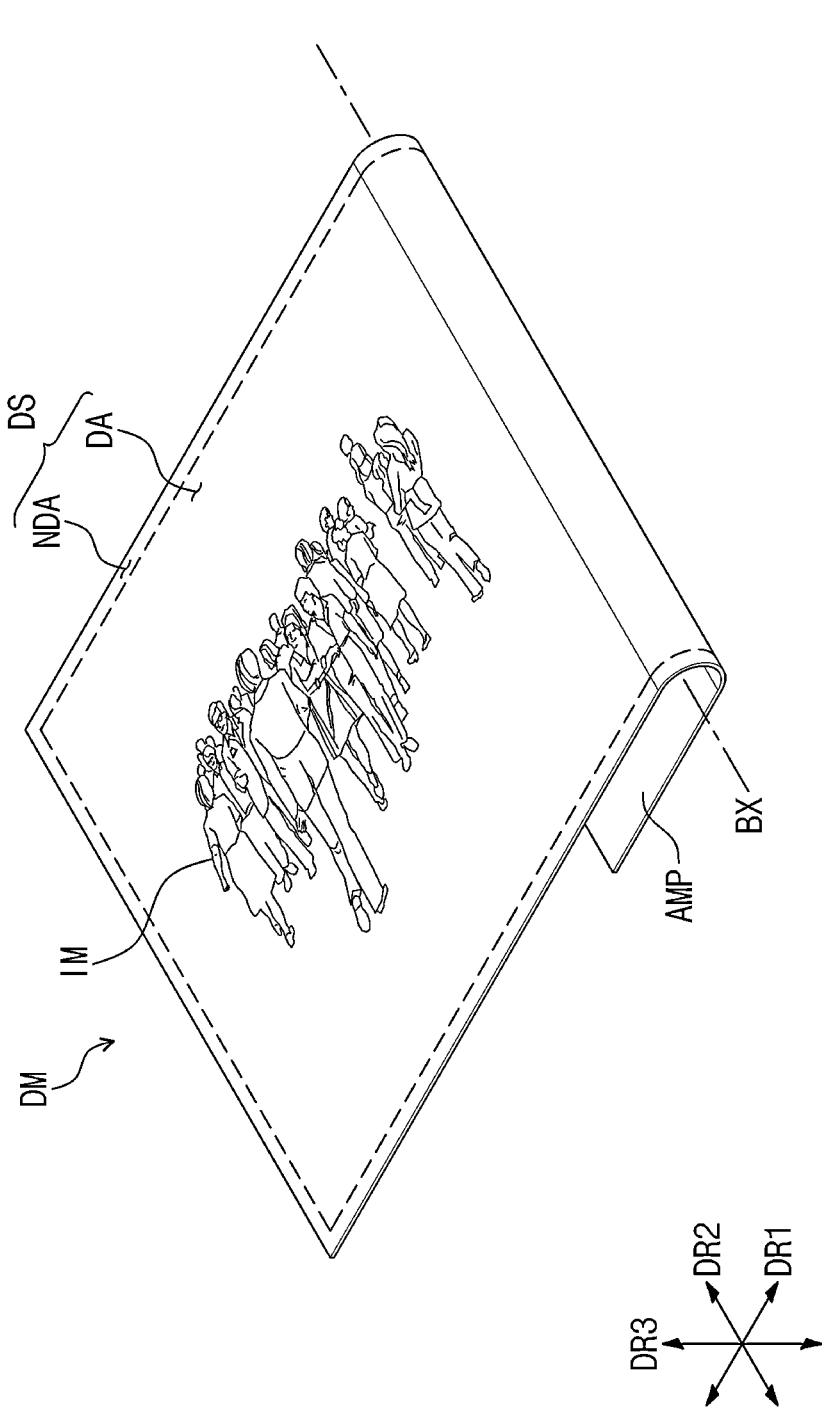
FIG. 5 is a perspective view illustrating a folded state of the display module accommodated in the case in a default mode illustrated in FIG. 1, according to an embodiment.
Figure 6:
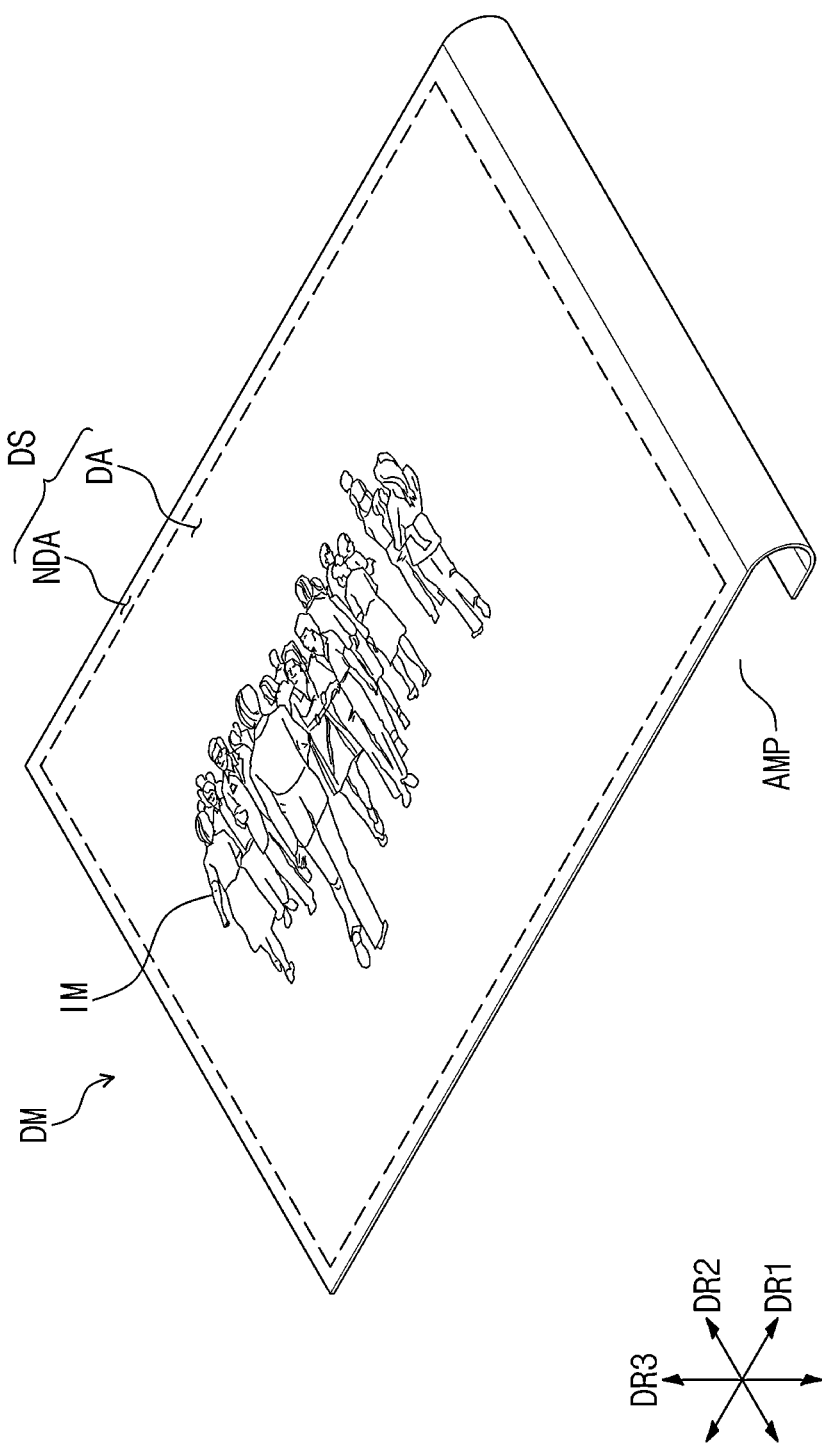
FIG. 6 is a perspective view illustrating a folded state of the display module accommodated in the case in an extended mode illustrated in FIG. 3, according to an embodiment.

FIG. 4 is a perspective view illustrating an unfolded state of the display module accommodated in the case illustrated in FIGS. 1 to 3, according to an embodiment. FIG. 5 is a perspective view illustrating a folded state of the display module accommodated in the case in the default mode illustrated in FIG. 1, according to an embodiment. FIG. 6 is a perspective view illustrating a folded state of the display module accommodated in the case in the extended mode illustrated in FIG. 3, according to an embodiment.

In an embodiment and referring to FIG. 4, the display module DM may have a rectangular shape with long sides extending in the first direction DR1 and short sides extending in the second direction DR2 crossing the first direction DR1. However, without being limited thereto, the display module DM may have various shapes such as a circular shape, a polygonal shape, and the like.

In an embodiment, the upper surface of the display module DM may be defined as a display surface DS and may have a plane defined by the first direction DR1 and the second direction DR2. Images IM generated by the display module DM may be provided to a user through the display surface DS.

In an embodiment, the display surface DS may include a display region DA and a non-display region NDA around the display region DA. The display region DA may display an image, and the non-display region NDA may not display an image. The non-display region NDA may surround the display region DA and may define the border of the display module DM that is printed in a certain color.

In an embodiment, the display module DM may sense an input applied from the outside. For example, the display module DM may sense a touch of the user as an external input and may display an image corresponding to a sensed signal.

In an embodiment, the display module DM may include an accommodated part AMP disposed adjacent to the display region DA. The accommodated part AMP may be disposed adjacent to one of opposite sides of the display module DM opposite to each other in the first direction DR1. The accommodated part AMP may substantially be the non-display region NDA. The accommodated part AMP may be defined as a non-display region NDA disposed adjacent to the one side of the display module DM.

In an embodiment, the accommodated part AMP may have a larger area than the non-display regions NDA disposed adjacent to opposite sides of the display module DM opposite to each other in the second direction DR2 and the non-display region NDA disposed adjacent to the opposite side of the display module DM in the first direction DR1.

In an embodiment and referring to FIGS. 1 and 5, the display module DM may be folded about a bending axis BX extending in the second direction DR2 and may be accommodated in the case CS. The display region DA of the display module DM may be exposed to the outside by the opening OP. In the default mode, a portion of the display region DA may be accommodated in the case CS and may not be exposed to the outside. The accommodated part AMP may also be accommodated in the case CS and may not be exposed to the outside.

In an embodiment and referring to FIGS. 3 and 6, the area of the display region DA exposed to the outside may be adjusted depending on the movement of the sliding case SC. When the sliding case SC moves as illustrated in FIG. 3, the entire display region DA may be unfolded flat and may be exposed to the outside. Accordingly, the display region DA exposed to the outside may be expanded. In the extended mode, the accommodated part AMP may be accommodated in the case CS and may not be exposed to the outside. A driver for driving elements of the display module DM may be disposed in the accommodated part AMP.

Figure 7:
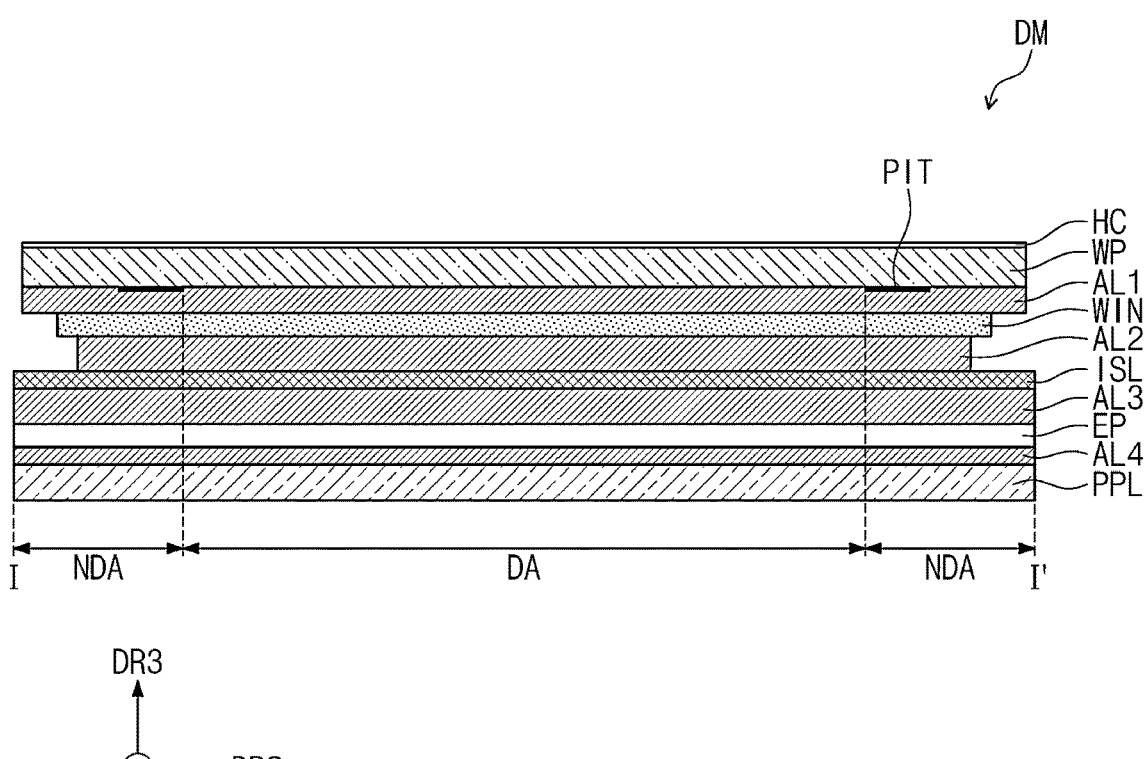
FIG. 7 is a sectional view of the display module illustrated in FIG. 4, according to an embodiment.

FIG. 7 is a sectional view of the display module illustrating the configuration of the display module illustrated in FIG. 4, according to an embodiment.

In FIG. 7, a section of the display module DM viewed in the first direction DR1 is illustrated, according to an embodiment.

In an embodiment and referring to FIG. 7, the display module DM may include an electronic panel EP, an impact absorbing layer ISL, a panel protection layer PPL, a window WIN, a window protection layer WP, a hard coating layer HC, and first to fourth adhesive layers AL1 to AL4, respectively.

Figure 8:
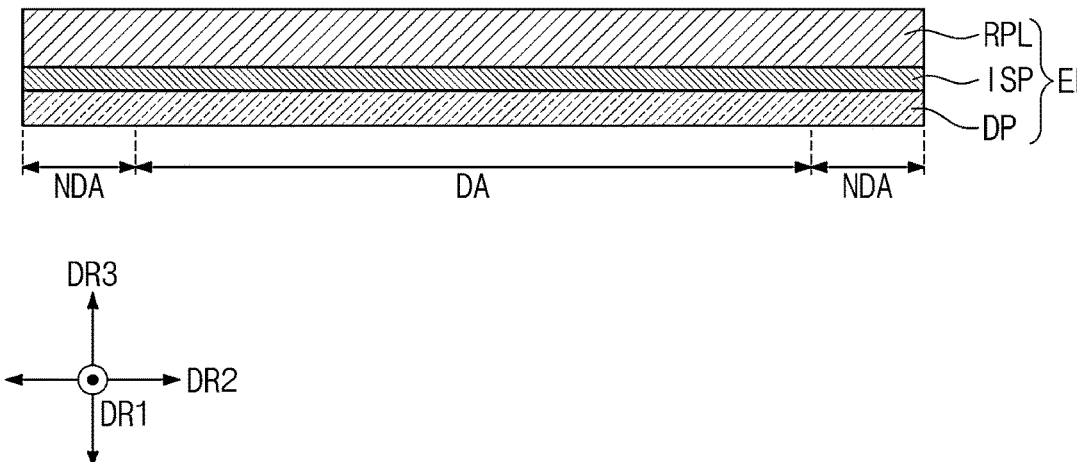
FIG. 8 is a sectional view of an electronic panel illustrating the configuration of the electronic panel illustrated in FIG. 7, according to an embodiment.

In an embodiment and referring to FIG. 8, the electronic panel EP may display an image. The electronic panel EP may include a display panel DP, an input sensing part ISP, and an anti-reflective layer RPL, and the configuration of the electronic panel EP will be described below with reference to FIG. 8.

In an embodiment, the impact absorbing layer ISL may be disposed on the electronic panel EP. The impact absorbing layer ISL may protect the electronic panel EP by absorbing external impact applied from above the display device DD toward the electronic panel EP. The impact absorbing layer ISL may be manufactured in the form of a stretchable film.

In an embodiment, the impact absorbing layer ISL may include a flexible plastic material. The flexible plastic material may be defined as a synthetic resin film. For example, the impact absorbing layer ISL may include a flexible plastic material such as polyimide (PI) or polyethylene terephthalate (PET).

In an embodiment, the window WIN may be disposed on the impact absorbing layer ISL. The window WIN may protect the electronic panel EP from external scratches. The window WIN may have a property of being optically clear. The window WIN may include glass. However, without being limited thereto, the window WIN may include a synthetic resin film.

In an embodiment, the window protection layer WP may be disposed on the window WIN. The window protection layer WP may include a flexible plastic material such as polyimide or polyethylene terephthalate. The hard coating layer HC may be disposed on the upper surface of the window protection layer WP.

In an embodiment, a printed layer PIT may be disposed on the lower surface of the window protection layer WP. The printed layer PIT may be black in color. However, the color of the printed layer PIT is not limited thereto. The printed layer PIT may be disposed adjacent to the periphery of the window protection layer WP. The printed layer PIT may overlap the non-display region NDA.

In an embodiment, the panel protection layer PPL may be disposed under the electronic panel EP. The panel protection layer PPL may protect a lower portion of the electronic panel EP. The panel protection layer PPL may include a flexible plastic material. For example, the panel protection layer PPL may include polyimide or polyethylene terephthalate.

In an embodiment, the first adhesive layer AL1 may be disposed between the window protection layer WP and the window WIN. The window protection layer WP and the window WIN may be bonded to each other by the first adhesive layer AL1. The first adhesive layer AL1 may cover the printed layer PIT.

In an embodiment, the second adhesive layer AL2 may be disposed between the window WIN and the impact absorbing layer ISL. The window WIN and the impact absorbing layer ISL may be bonded to each other by the second adhesive layer AL2.

In an embodiment, the third adhesive layer AL3 may be disposed between the impact absorbing layer ISL and the electronic panel EP. The impact absorbing layer ISL and the electronic panel EP may be bonded to each other by the third adhesive layer AL3.

In an embodiment, the fourth adhesive layer AL4 may be disposed between the electronic panel EP and the panel protection layer PPL. The electronic panel EP and the panel protection layer PPL may be bonded to each other by the fourth adhesive layer AL4.

In an embodiment, the first to fourth adhesive layers AL1 to AL4, respectively, may include a pressure sensitive adhesive (PSA) or an optically clear adhesive (OCA). However, the type of adhesive is not limited thereto.

FIG. 8 is a sectional view of the electronic panel illustrating the configuration of the electronic panel illustrated in FIG. 7.

In FIG. 8, a section of the electronic panel EP viewed in the first direction DR1 is illustrated, according to an embodiment.

In an embodiment and referring to FIG. 8, the electronic panel EP may include the display panel DP, the input sensing part ISP disposed on the display panel DP, and the anti-reflective layer RPL disposed on the input sensing part ISP. The display panel DP may be a flexible display panel. For example, the display panel DP may include a flexible substrate and a plurality of elements disposed on the flexible substrate.

In an embodiment, the display panel DP may be an emissive display panel, but is not particularly limited. For example, the display panel DP may be an organic light emitting display panel or an inorganic light emitting display panel. An emissive layer of the organic light emitting display panel may include an organic luminescent material. An emissive layer of the inorganic light emitting display panel may include quantum dots, quantum rods, and the like. Hereinafter, it will be exemplified that the display panel DP is an organic light emitting display panel.

In an embodiment, the input sensing part ISP may include a plurality of sensors (not illustrated) for sensing an external input. For example, the input sensing part ISP may sense the external input in a capacitive type. However, a sensing method of the input sensing part ISP is not limited thereto. The input sensing part ISP may be directly formed on the display panel DP when the electronic panel EP is manufactured.

In an embodiment, the anti-reflective layer RPL may be disposed on the input sensing part ISP. The anti-reflective layer RPL may be directly formed on the input sensing part ISP when the electronic panel EP is manufactured. The anti-reflective layer RPL may be defined as a film for preventing reflection of external light. The anti-reflective layer RPL may decrease the reflectance of external light incident toward the display panel DP from above the display device DD.

In an embodiment, when external light travelling toward the display panel DP is reflected from the display panel DP and provided back to the user, the user may visually recognize the external light as in a mirror. To prevent such a phenomenon, the anti-reflective layer RPL may include a plurality of color filters that display the same colors as those of pixels of the display panel DP.

In an embodiment, the color filters may filter the external light into the same colors as those of the pixels. In this case, the external light may not be visible to the user. However, without being limited thereto, the anti-reflective layer RPL may include a phase retarder and/or a polarizer to decrease the reflectance of the external light.

In an embodiment, the input sensing part ISP may be directly formed on the display panel DP, and the anti-reflective layer RPL may be directly formed on the input sensing part ISP. However, the invention is not limited thereto. For example, in an embodiment the input sensing part ISP may be separately manufactured and may be attached to the display panel DP by an adhesive layer, and the anti-reflective layer RPL may be separately manufactured and may be attached to the input sensing part ISP by an adhesive layer.

Figure 9:
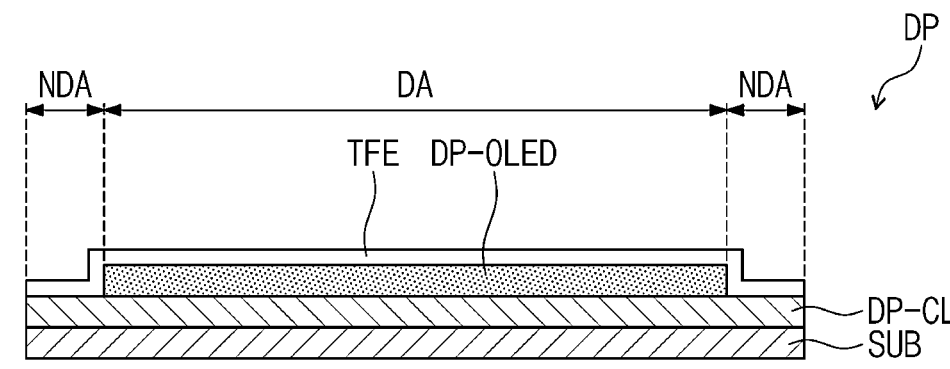
FIG. 9 is a sectional view of the display panel illustrated in FIG. 8, according to an embodiment.
Figure 9:
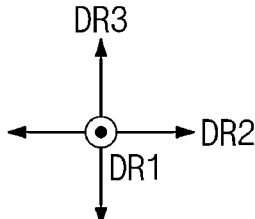

FIG. 9 is a sectional view of the display panel illustrating the configuration of the display panel illustrated in FIG. 8, according to an embodiment.

In FIG. 9, a section of the display panel DP viewed in the first direction DR1 is illustrated, according to an embodiment.

In an embodiment and referring to FIG. 9, the display panel DP may include a substrate SUB, a circuit element layer DP-CL disposed on the substrate SUB, a display element layer DP-OLED disposed on the circuit element layer DP-CL, and a thin film encapsulation layer TFE disposed on the display element layer DP-OLED.

In an embodiment, the substrate SUB may include a display region DA and a non-display region NDA disposed around the display region DA. The substrate SUB may include a flexible plastic material such as polyimide. The display element layer DP-OLED may be disposed on the display region DA.

In an embodiment, a plurality of pixels may be disposed in the display region DA. Each of the pixels may include a light emitting element. The light emitting element may be connected to transistors disposed in the circuit element layer DP-CL and may be disposed in the display element layer DP-OLED.

In an embodiment, the thin film encapsulation layer TFE may be disposed on the circuit element layer DP-CL to cover the display element layer DP-OLED. The thin film encapsulation layer TFE may include inorganic layers and an organic layer between the inorganic layers. The inorganic layers may protect the pixels from moisture/oxygen. The organic layer may protect the pixels from foreign matter such as dust particles.

Figure 10:
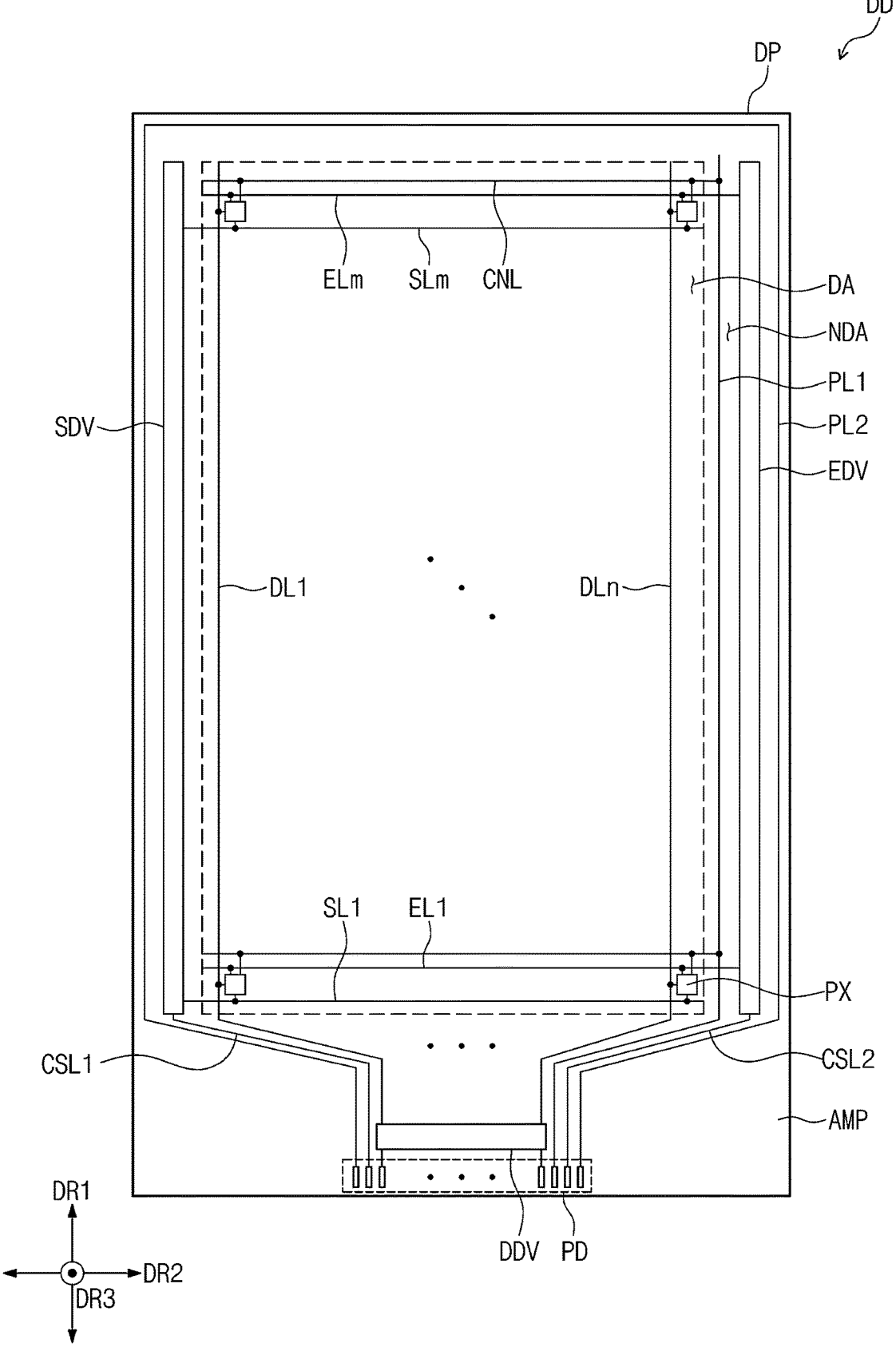
FIG. 10 is a plan view of the display panel illustrated in FIG. 9, according to an embodiment.

FIG. 10 is a plan view of the display panel illustrated in FIG. 9, according to an embodiment.

In an embodiment and referring to FIG. 10, the display device DD may include the display panel DP, a scan driver SDV, a data driver DDV, a light emission driver EDV, and a plurality of pads PD.

In an embodiment, the display panel DP may have a rectangular shape with long sides extending in the first direction DR1 and short sides extending in the second direction DR2. However, the shape of the display panel DP is not limited thereto. The display panel DP may include a display region DA and a non-display region NDA surrounding the display region DA.

In an embodiment, the display panel DP may include a plurality of pixels PX, a plurality of scan lines SL1 to SLm, a plurality of data lines DL1 to DLn, a plurality of light emission lines EL1 to ELm, first and second control lines CSL1 and CSL2, respectively, first and second power lines PL1 and PL2, respectively, and a plurality of connecting lines CNL. Here, "m" and "n" are natural numbers.

In an embodiment, the pixels PX may be disposed in the display region DA. The scan driver SDV and the light emission driver EDV may be disposed in the non-display regions NDA adjacent to opposite sides of the display panel DP opposite to each other in the second direction DR2. The data driver DDV may be disposed in the non-display region NDA adjacent to one of opposite sides of the display panel DP opposite to each other in the first direction DR1. The data driver DDV may be disposed adjacent to the lower end of the display panel DP when viewed from above the plane.

In an embodiment and referring to FIG. 10, the accommodated part AMP may be defined as a non-display region NDA disposed adjacent to the lower end of the display panel DP. The data driver DDV may be disposed on the accommodated part AMP.

In an embodiment, the scan lines SL1 to SLm may extend in the second direction DR2 and may be connected to the pixels PX and the scan driver SDV. The data lines DL1 to DLn may extend in the first direction DR1 and may be connected to the pixels PX and the data driver DDV. The light emission lines EL1 to ELm may extend in the second direction DR2 and may be connected to the pixels PX and the light emission driver EDV.

In an embodiment, the first power line PL1 may extend in the first direction DR1 and may be disposed in the non-display region NDA. The first power line PL1 may be disposed between the display region DA and the light emission driver EDV.

In an embodiment, the connecting lines CNL may extend in the second direction DR2 and may be arranged in the first direction DR1. The connecting lines CNL may be connected to the first power line PL1 and the pixels PX. A first voltage may be applied to the pixels PX through the first power line PL1 and the connecting lines CNL connected with each other.

In an embodiment, the second power line PL2 may be disposed in the non-display region NDA and may extend along the long sides of the display panel DP and the short side of the display panel DP where the data driver DDV is not disposed. The second power line PL2 may be disposed outward of the scan driver SDV and the light emission driver EDV.

In an embodiment, although not illustrated, the second power line PL2 may extend toward the display region DA and may be connected to the pixels PX. A second voltage having a lower level than the first voltage may be applied to the pixels PX through the second power line PL2.

In an embodiment, the first control line CSL1 may be connected to the scan driver SDV and may extend toward the lower end of the display panel DP. The second control line CSL2 may be connected to the light emission driver EDV and may extend toward the lower end of the display panel DP. The data driver DDV may be disposed between the first control line CSL1 and the second control line CSL2.

In an embodiment, the pads PD may be disposed in the non-display region NDA adjacent to the lower end of the display panel DP and may be disposed closer to the lower end of the display panel DP than the data driver DDV. The data driver DDV, the first power line PL1, the second power line PL2, the first control line CSL1, and the second control line CSL2 may be connected to the pads PD. The data lines DL1 to DLn may be connected to the data driver DDV, and the data driver DDV may be connected to the pads PD corresponding to the data lines DL1 to DLn.

In an embodiment, although not illustrated, the display device DD may further include a timing controller for controlling operations of the scan driver SDV, the data driver DDV, and the light emission driver EDV and a voltage generator for generating the first and second voltages. The timing controller and the voltage generator may be connected to the pads PD through a printed circuit board.

In an embodiment, the scan driver SDV may generate a plurality of scan signals, and the scan signals may be applied to the pixels PX through the scan lines SL1 to SLm. The data driver DDV may generate a plurality of data voltages, and the data voltages may be applied to the pixels PX through the data lines DL1 to DLn. The light emission driver EDV may generate a plurality of light emission signals, and the light emission signals may be applied to the pixels PX through the light emission lines EL1 to ELm.

In an embodiment, the pixels PX may receive the data voltages in response to the scan signals. The pixels PX may display an image by emitting light having luminance corresponding to the data voltages in response to the light emission signals.

Figure 11:
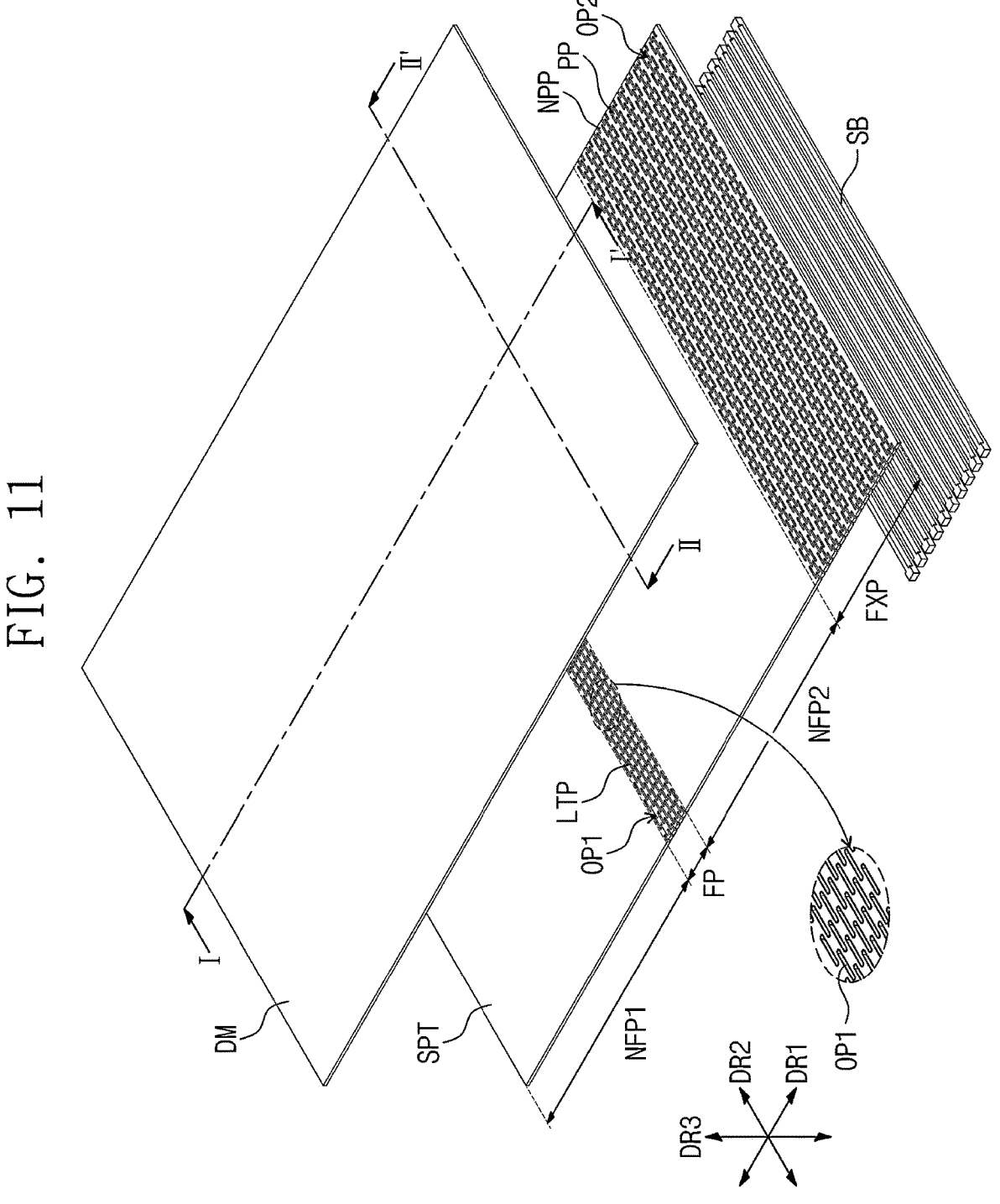
FIG. 11 is a perspective view illustrating a support plate and support bars disposed under the display module illustrated in FIG. 4 and accommodated in the case illustrated in FIG. 1, according to an embodiment.

FIG. 11 is a perspective view illustrating a support plate and support bars disposed under the display module illustrated in FIG. 4 and accommodated in the case illustrated in FIG. 1, according to an embodiment.

In an embodiment and referring to FIG. 11, the display module DM is illustrated together with the support plate SPT and the support bars SB, where the support plate SPT is illustrated in an unfolded state. In addition, for convenience of description, the display region DA, the non-display region NDA, and the images IM illustrated in FIG. 4 are omitted in FIG. 11.

In an embodiment and referring to FIG. 11, the support plate SPT may be disposed under the display module DM. The support plate SPT may include a folding part FP, a first non-folding part NFP1, a second non-folding part NFP2, and a flexible part FXP. The folding part FP may extend in the second direction DR2. The folding part FP may be disposed between the first non-folding part NFP1 and the second non-folding part NFP2. The first non-folding part NFP1, the folding part FP, and the second non-folding part NFP2 may be arranged in the first direction DR1.

In an embodiment, the folding part FP may be flexible. For example, the folding part FP may be a part that is folded when the display device DD is folded as illustrated in FIG. 2. The first non-folding part NFP1 and the second non-folding part NFP2 may remain flat when the display device DD is folded. The first non-folding part NFP1 and the second non-folding part NFP2 may be defined as flat parts. That is, the flat parts may include the first non-folding part NFP1 and the second non-folding part NFP2.

In an embodiment, a plurality of first openings OP1 may be defined in the folding part FP. The first openings OP1 may extend in the second direction DR2. The first openings OP1 may be arranged in the first direction DR1 and the second direction DR2. The first openings OP1 in the $h^{th}$ row and the first openings OP1 in the $(h+1)^{th}$ row may be staggered with respect to each other. Here, "h" is a natural number. The rows may correspond to the second direction DR2.

In an embodiment, since the first openings OP1 are defined in the folding part FP, the folding part FP may be more flexible than the first non-folding part NFP1 and the second non-folding part NFP2. Since the first openings OP1 are defined in the folding part FP, the folding part FP may be flexibly folded. The folding part FP having the first openings OP1 defined therein may be defined as a grid pattern LTP.

In an embodiment, the flexible part FXP may extend from the second non-folding part NFP2 (e.g., a flat part) in the first direction DR1. The flexible part FXP may have a plurality of second openings OP2 defined therein. The second openings OP2 may have substantially the same shape as the first openings OP1. Since the second openings OP2 are defined in the flexible part FXP, the flexible part FXP may be more flexible than the first non-folding part NFP1 and the second non-folding part NFP2. Since the second openings OP2 are defined in the flexible part FXP, the flexible part FXP may be flexibly folded.

In an embodiment, the flexible part FXP may include a plurality of pattern parts PP in which the second openings OP2 are defined and a plurality of non-pattern parts NPP disposed between the pattern parts PP. The second openings OP2 may not be defined in the non-pattern parts NPP.

In an embodiment, the plurality of support bars SB may be disposed under the flexible part FXP. The support bars SB may be arranged in the first direction DR1 and may extend in the second direction DR2. When viewed from above the plane, the support bars SB may be disposed to overlap the non-pattern parts NPP.

In an embodiment, since the flexible part FXP and the folding part FP are more flexible than the first non-folding part NFP1 and the second non-folding part NFP2, the flexible part FXP and the folding part FP may have a lower elastic modulus than the first non-folding part NFP1 and the second non-folding part NFP2.

In an embodiment, the support plate SPT and the support bars SB may include the same metallic material. For example, the support plate SPT and the support bars SB may include stainless steel. However, the metallic materials of the support plate SPT and the support bars SB are not limited thereto.

Figure 12:
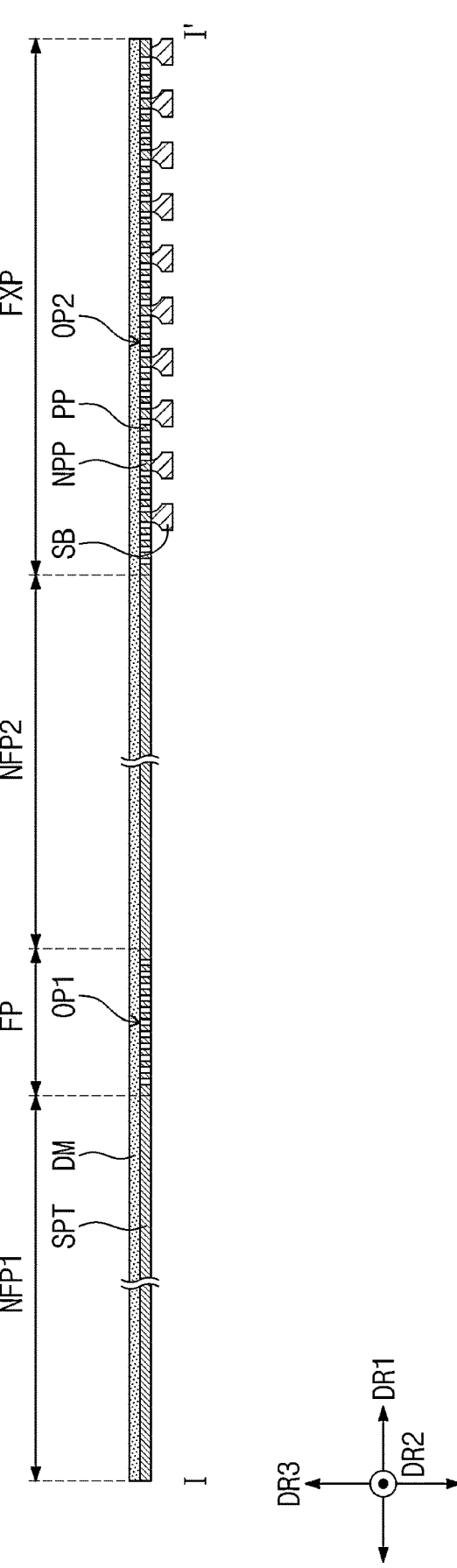
FIG. 12 is a sectional view taken along line I-I' illustrated in FIG. 11, according to an embodiment.

FIG. 12 is a sectional view taken along line I-I' illustrated in FIG. 11, according to an embodiment.

In FIG. 12, the display module DM, the support plate SPT, and the support bars SB are illustrated in a coupled state, according to an embodiment.

In an embodiment and referring to FIGS. 11 and 12, the support plate SPT may be disposed on the lower surface of the display module DM opposite to the front surface of the display module DM (e.g., the display surface DS) and may be coupled to the lower surface of the display module DM. For example, in an embodiment, an adhesive layer (not illustrated) may be disposed between the support plate SPT and the display module DM, and the support plate SPT and the display module DM may be bonded to each other by the adhesive layer. The support plate SPT may be disposed on the lower surface of the display module DM and may support the display module DM.

In an embodiment, the support bars SB may be disposed on the lower surface of the flexible part FXP and may be coupled to the flexible part FXP. The support bars SB may be connected to the flexible part FXP by a bonding method using a laser beam, and this configuration will be described below in detail. The support bars SB may be disposed on the lower surfaces of the non-pattern parts NPP and may be connected to the lower surfaces of the non-pattern parts NPP, respectively.

In an embodiment, each of the support bars SB may have a greater thickness than the support plate SPT. The thickness may be defined as a numerical value measured in the third direction DR3.

Figure 13:
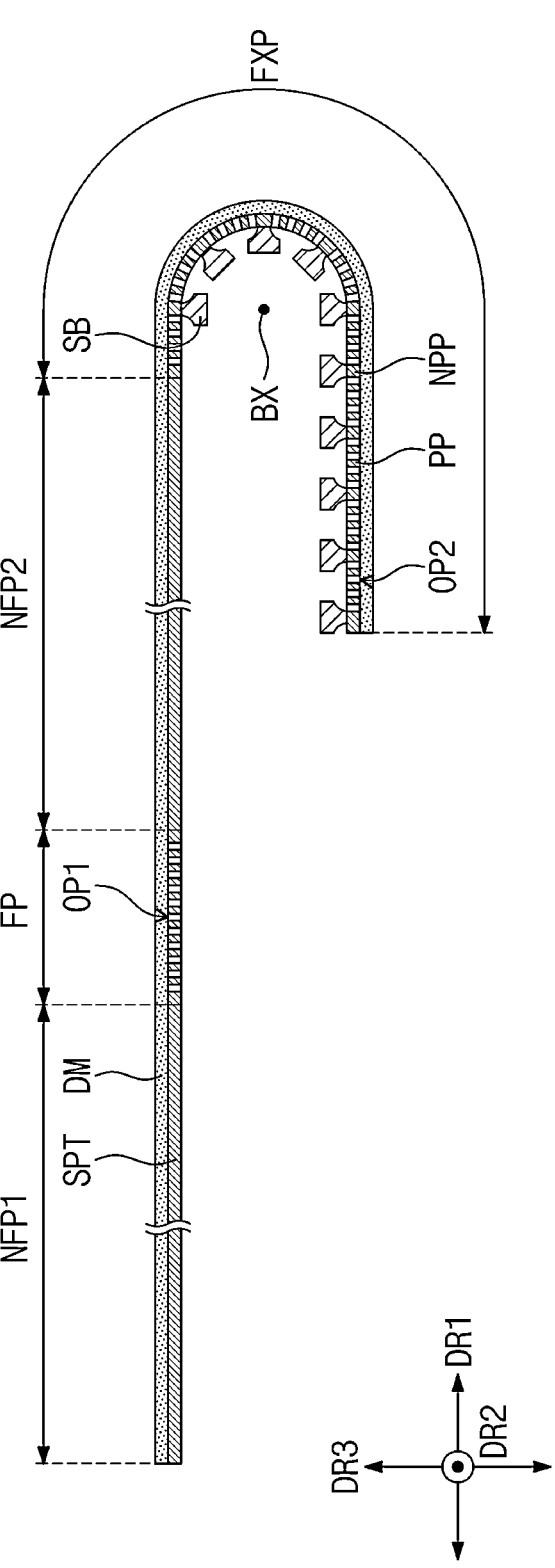
FIG. 13 is a sectional view illustrating a bent state of the display module and the support plate illustrated in FIG. 12, according to an embodiment.

FIG. 13 is a sectional view illustrating a bent state of the display module and the support plate illustrated in FIG. 12, according to an embodiment.

The state illustrated in FIG. 13, according to an embodiment, may substantially correspond to the default mode and the unfolded state of the display device DD illustrated in FIG. 1. In addition, the state illustrated in FIG. 13 may substantially correspond to the bent state of the display module DM illustrated in FIG. 5.

In an embodiment and referring to FIGS. 1, 5, and 13, the display module DM and the support plate SPT may be folded about the bending axis BX extending in the second direction DR2. Specifically, the flexible part FXP and the part of the display module DM disposed on the flexible part FXP may be folded about the bending axis BX. Accordingly, the flexible part FXP may be deformed to have the shape of "U". One portion of the flexible part FXP may be disposed in a curved shape, and another portion of the flexible part FXP may be disposed below the second non-folding part NFP2 and may extend in the first direction DR1.

In an embodiment, the support bars SB may be arranged along the folded shape of the flexible part FXP. Accordingly, some of the support bars SB may be arranged in a curved form, and other support bars SB may be disposed below the second non-folding part NFP2 and may be arranged in the first direction DR1.

Figure 14:
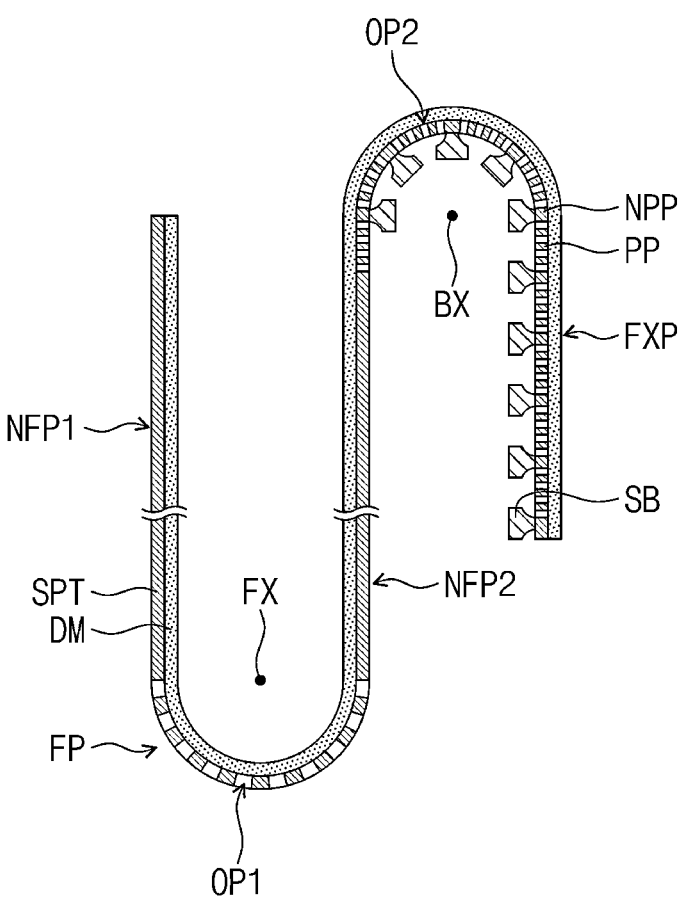
FIG. 14 is a sectional view illustrating a folded state of a folding part illustrated in FIG. 13, according to an embodiment.
Figure 14:
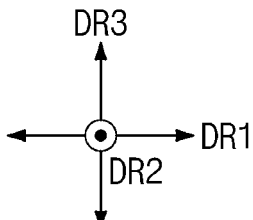

FIG. 14 is a sectional view illustrating a folded state of the folding part illustrated in FIG. 13, according to an embodiment.

The state illustrated in FIG. 14, according to an embodiment, may substantially correspond to the folded state of the display device DD illustrated in FIG. 2.

In an embodiment and referring to FIGS. 2 and 14, the display module DM and the support plate SPT may be folded about a folding axis FX extending in the second direction DR2. Specifically, the folding part FP may be folded about the folding axis FX, and the part of the display module DM on the first non-folding part NFP1 and the part of the display module DM on the second non-folding part NFP2 may face each other.

Figure 15:
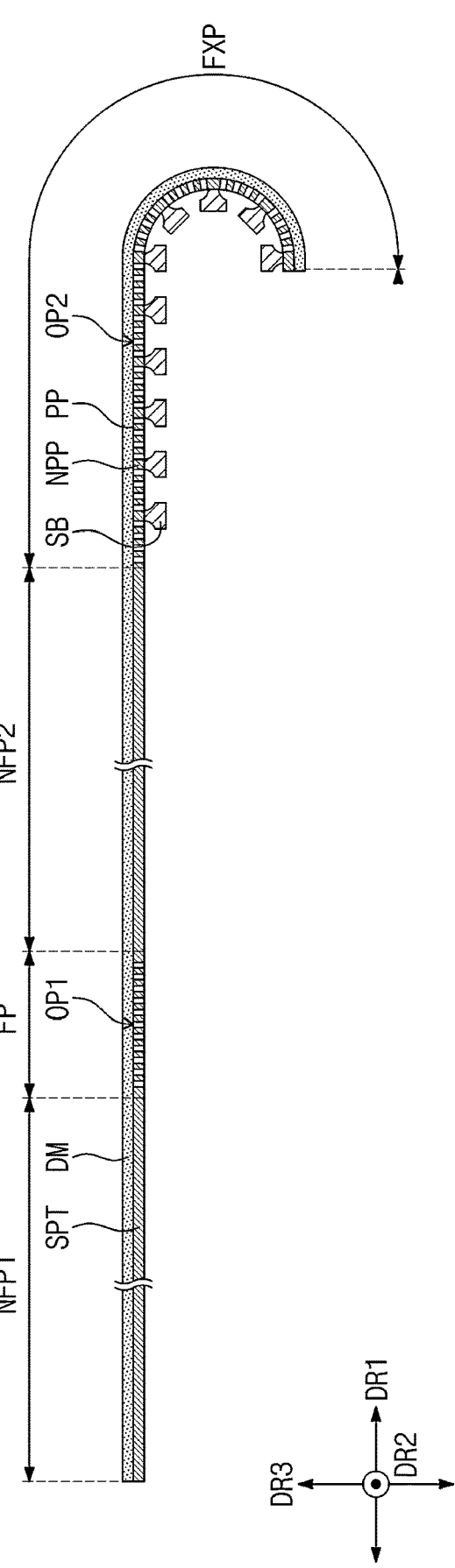
FIG. 15 is a sectional view illustrating a deformed state of a flexible part illustrated in FIG. 13, according to an embodiment.

FIG. 15 is a view illustrating a deformed state of the flexible part illustrated in FIG. 13, according to an embodiment.

In an embodiment, FIG. 15 may substantially correspond to the extended mode of the display device DD illustrated in FIG. 3. In addition, the state illustrated in FIG. 15 may correspond to the bent state of the display module DM illustrated in FIG. 6.

In an embodiment and referring to FIGS. 3, 6, and 15, in the extended mode, the flat part of the display module DM may be extended, and the area of the display region DA exposed to the outside may be expanded accordingly. In the extended mode, the area of the flat portion of the flexible part FXP disposed side by side with the second non-folding part NFP2 in the horizontal direction may be expanded depending on the movement of the sliding case SC.

In an embodiment, the support bars SB may be disposed under the flexible part FXP disposed flat in the extended mode. As the area of the flat portion of the flexible part FXP is expanded, the number of support bars SB disposed on the lower surface of the flexible part FXP and arranged in the first direction DR1 may also be increased.

In an embodiment, the support plate SPT may support the flat part of the display module DM. However, since the flexible part FXP has a lower elastic modulus than the first and second non-folding parts NFP1 and NFP2, respectively, the support force of the flexible part FXP disposed flat may be too weak to support the display module DM.

In an embodiment, to supplement the support force of the flexible part FXP, the support bars SB may be disposed under the flexible part FXP disposed flat and may support the flexible part FXP. Accordingly, the support bars SB and the flexible part FXP may support the display module DM together.

Figure 16:
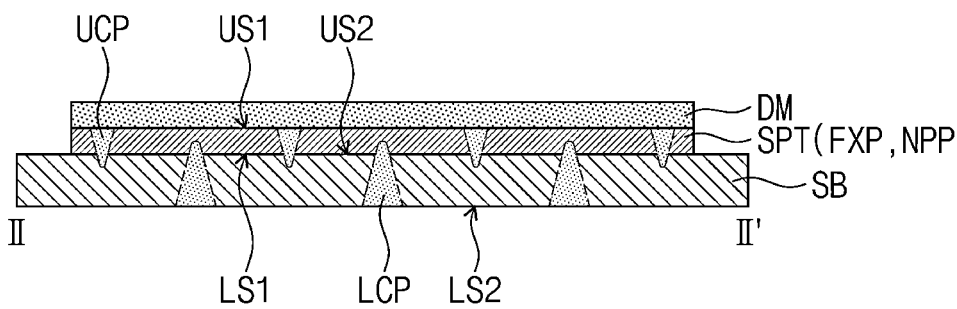
FIG. 16 is a sectional view taken along line II-II' illustrated in FIG. 11, according to an embodiment.
Figure 16:
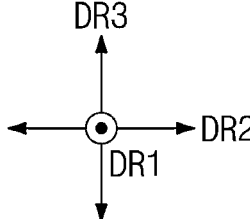

FIG. 16 is a sectional view taken along line II-II' illustrated in FIG. 11, according to an embodiment.

In an embodiment and referring to FIG. 16, the display module DM, the support plate SPT, and the support bars SB are illustrated in a coupled state. Although a connected state of one support bar SB and the support plate SPT is illustrated in the sectional view of FIG. 16, the other support bars SB may also be connected to the support plate SPT in the same manner. FIG. 16 may be a sectional view of the non-pattern part NPP and the support bar SB connected to the non-pattern part NPP.

In an embodiment and referring to FIG. 16, the support plate SPT may be disposed under the display module DM, and the support bar SB may be disposed under the support plate SPT. In the second direction DR2, the width of the support bar SB may be greater than the width of the support plate SPT and the width of the display module DM.

In an embodiment, the support bar SB may be connected to the support plate SPT. For example, the support bar SB may be connected to the support plate SPT by a plurality of upper connecting parts UCP and a plurality of lower connecting parts LCP.

Hereinafter, an upper surface US1 of the flexible part FXP is defined as a surface facing the display module DM, and a lower surface LS1 of the flexible part FXP is defined as a surface facing away from the upper surface US1 of the flexible part FXP. In addition, an upper surface US2 of the support bar SB is defined as a surface facing the flexible part FXP, and a lower surface LS2 of the support bar SB is defined as a surface facing away from the upper surface US2 of the support bar SB.

In an embodiment, the upper connecting parts UCP may extend from the upper surface US1 of the flexible part FXP of the support plate SPT into the support bar SB through the flexible part FXP. The upper connecting parts UCP may extend to a certain portion of the support bar SB from the upper surface US2 of the support bar SB. Accordingly, the upper connecting parts UCP may not extend to the lower surface LS2 of the support bar SB and may be spaced apart from the lower surface LS2 of the support bar SB.

In an embodiment, the lower connecting parts LCP may extend from the lower surface LS2 of the support bar SB into the flexible part FXP through the support bar SB. The lower connecting parts LCP may extend to a certain portion of the flexible part FXP from the lower surface LS2 of the flexible part FXP. Accordingly, the lower connecting parts LCP may not extend to the upper surface US1 of the flexible part FXP and may be spaced apart from the upper surface US1 of the flexible part FXP.

In an embodiment, the widths of the upper connecting parts UCP in a horizontal direction (e.g., the first direction DR1 or the second direction DR2) may be gradually decreased from top to bottom. For example, the widths of the upper connecting parts UCP may be gradually decreased from the upper surface US1 of the flexible part FXP toward the lower surface LS2 of the support bar SB.

In an embodiment, the widths of the lower connecting parts LCP in the horizontal direction may be gradually decreased from bottom to top. For example, the widths of the lower connecting parts LCP may be gradually decreased from the lower surface LS2 of the support bar SB toward the upper surface US1 of the flexible part FXP. The upper connecting parts UCP may have a smaller size than the lower connecting parts LCP.

In an embodiment, the upper and lower connecting parts UCP and LCP, respectively, may be formed by melting portions of the flexible part FXP and portions of the support bar SB using a laser beam. The portions of the flexible part FXP melted by the laser beam may be portions of the non-pattern part NPP. For example, the portions where the upper and lower connecting parts UCP and LCP are formed are illustrated by dotted lines.

In an embodiment, since the upper connecting parts UCP are formed by melting portions of the flexible part FXP and the support bar SB that have the same metallic material, the upper connecting parts UCP may be substantially integrally formed with the flexible part FXP and the support bar SB. In addition, since the lower connecting parts LCP are formed by melting portions of the support bar SB and the flexible part FXP that have the same metallic material, the lower connecting parts LCP may be substantially integrally formed with the support bar SB and the flexible part FXP.

In an embodiment, the upper connecting parts UCP and the lower connecting parts LCP may be alternately arranged in the second direction DR2. Among the upper connecting parts UCP, two upper connecting parts UCP may be disposed adjacent to opposite sides of the support bar SB opposite to each other in the second direction DR2, respectively. The lower connecting parts LCP may be disposed between the upper connecting parts UCP disposed adjacent to the opposite sides of the support bar SB.

Figure 17A:
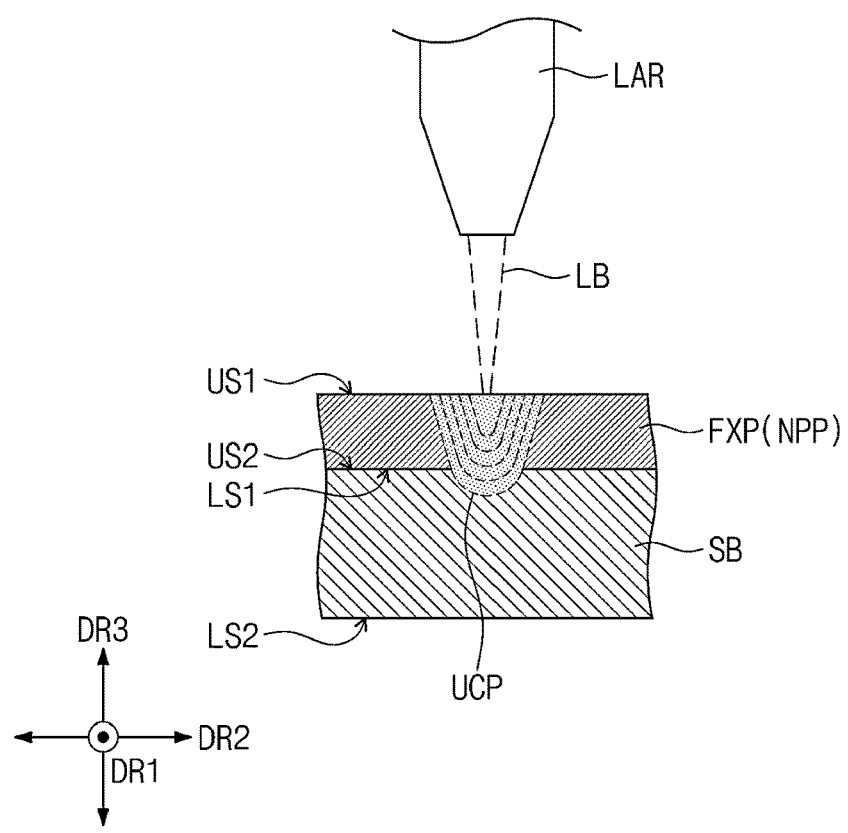
FIG. 17A is a sectional view for explaining a method of forming one of upper connecting parts illustrated in FIG. 16, according to an embodiment.
Figure 17B:
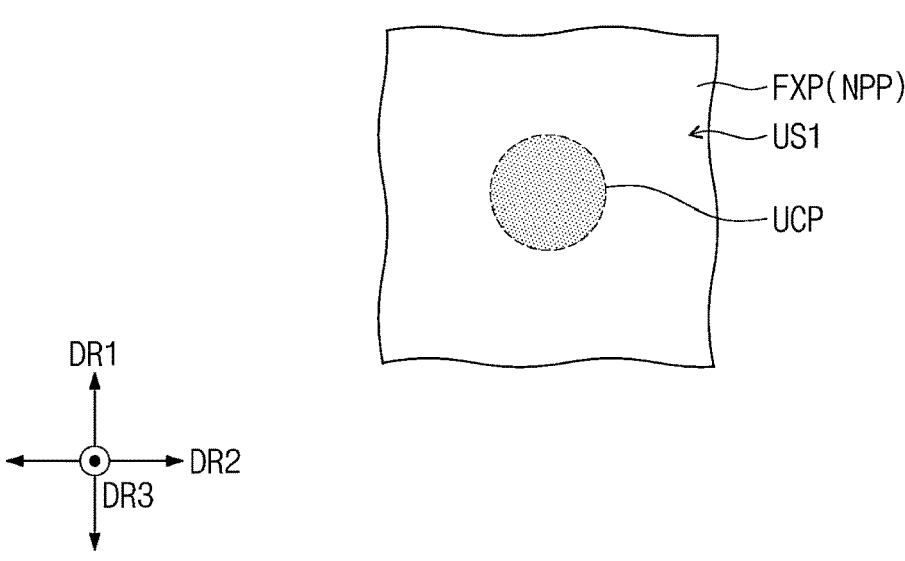
FIG. 17B is a view for explaining a method of forming one of upper connecting parts illustrated in FIG. 16, according to an embodiment.

FIGS. 17A and 17B are views for explaining a method of forming one of the upper connecting parts illustrated in FIG. 16, according to an embodiment.

In an embodiment, although a method of forming one upper connecting part UCP is illustrated as an example, the other upper connecting parts UCP may also be formed by the same method.

In an embodiment and referring to FIG. 17A, a laser LAR may be disposed over the upper surface US1 of the flexible part FXP, and a laser beam LB generated by the laser LAR may be applied toward the upper surface US1 of the flexible part FXP. The laser LAR may be disposed perpendicular to the upper surface US1 of the flexible part FXP. The laser LAR may be a nanosecond laser, a femtosecond laser, or a picosecond laser.

In an embodiment, a portion of the flexible part FXP (e.g., the non-pattern part NPP) may be gradually melted from the upper surface US1 of the portion of the flexible part FXP by heat of the laser beam LB. The portion of the flexible part FXP may be gradually melted in the depth direction of the flexible part FXP from the upper surface US1 of the flexible part FXP toward the lower surface LS1 of the flexible part FXP.

In an embodiment, when the portion of the flexible part FXP is melted up to the lower surface LS1 of the flexible part FXP in the depth direction of the flexible part FXP, a portion of the support bar SB may be gradually melted from the upper surface US2 of the support bar SB. The portion of the support bar SB may be melted in the depth direction of the support bar SB from the upper surface US2 of the support bar SB toward the lower surface LS2 of the support bar SB.

In an embodiment, the laser LAR may be removed before the portion of the support bar SB is melted up to the lower surface LS2 of the support bar SB. Accordingly, the portion of the support bar SB may not be melted up to the lower surface LS2 of the support bar SB. Thus, the flexible part FXP may be gradually melted from the upper surface US1 of the flexible part FXP by the laser beam LB, and the support bar SB may be melted by the laser beam LB to a certain portion of the support bar SB that is spaced apart from the lower surface LS2 of the support bar SB.

In an embodiment, the portion of the flexible part FXP and the portion of the support bar SB may be melted to form the upper connecting part UCP. Accordingly, the upper connecting part UCP may be integrally formed with the flexible part FXP and the support bar SB.

In an embodiment, the upper surface US1 of the flexible part FXP, to which the laser beam LB is applied first and which is heated for the longest period of time, may be most extensively melted, and since the heating time is decreased from the upper surface US1 of the flexible part FXP toward the lower surface LS2 of the support bar SB, the amount of molten material may be decreased from the upper surface US1 of the flexible part FXP toward the lower surface LS2 of the support bar SB. Accordingly, the upper connecting part UCP may have a decreasing width from top to bottom.

In an embodiment, the process of forming the upper connecting part UCP may be performed before the display module DM is attached to the upper surface of the support plate SPT.

In an embodiment and referring to FIGS. 17A and 17B, when the laser LAR is disposed perpendicular to the upper surface US1 of the flexible part FXP, the focus of the laser beam LB may have a circular shape on the upper surface US1 of the flexible part FXP. Accordingly, the upper connecting part UCP formed by the laser beam LB may have a circular shape when viewed from above the plane.

Figure 18A:
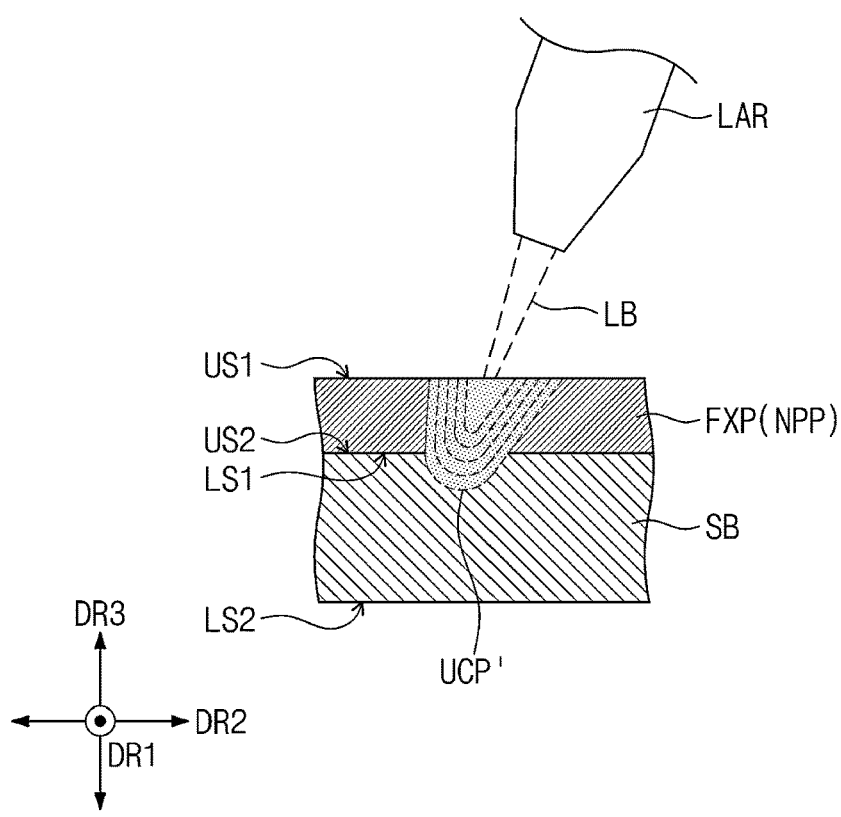
FIG. 18A is a sectional view for explaining a method of forming an upper connecting part, according to an embodiment.
Figure 18B:
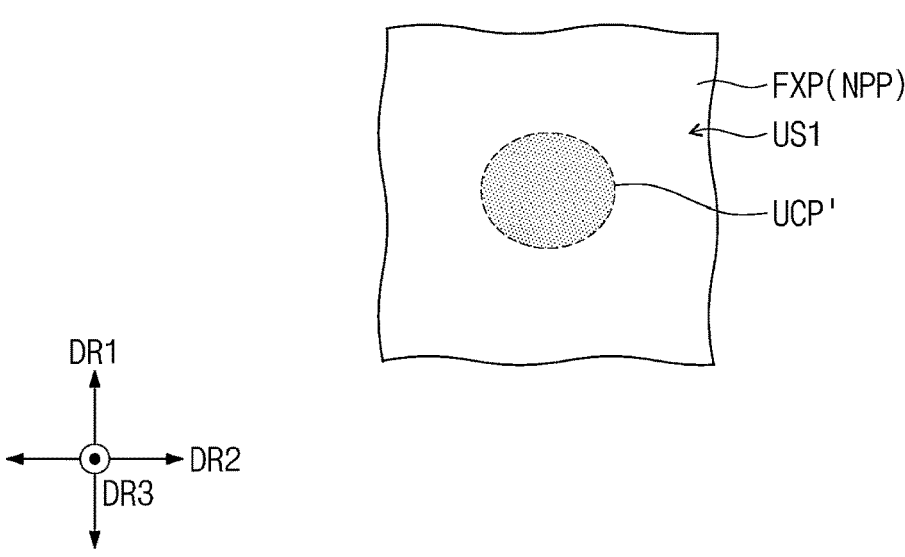
FIG. 18B is a view for explaining a method of forming an upper connecting part, according to an embodiment.

FIGS. 18A and 18B are views for explaining a method of forming an upper connecting part, according to an embodiment.

In an embodiment and referring to FIGS. 18A and 18B, although the laser LAR is disposed perpendicular to the upper surface US1 of the flexible part FXP in FIGS. 17A and 17B, a laser LAR in FIGS. 18A and 18B may be disposed to be inclined with respect to the upper surface US1 of the flexible part FXP.

In an embodiment, the method of forming the upper connecting part UCP' may be the same as the method of forming the upper connecting part UCP illustrated in FIGS. 17A and 17B, except for the arrangement of the laser LAR. Accordingly, the upper connecting part UCP' may be formed by applying a laser beam LB to the upper surface US1 of the flexible part FXP.

In an embodiment, when the laser LAR is disposed to be inclined with respect to the upper surface US1 of the flexible part FXP, the focus of the laser beam LB may have an oval shape on the upper surface US1 of the flexible part FXP. Accordingly, the upper connecting part UCP' formed by the laser beam LB may have an oval shape when viewed from above the plane.

Figure 19:
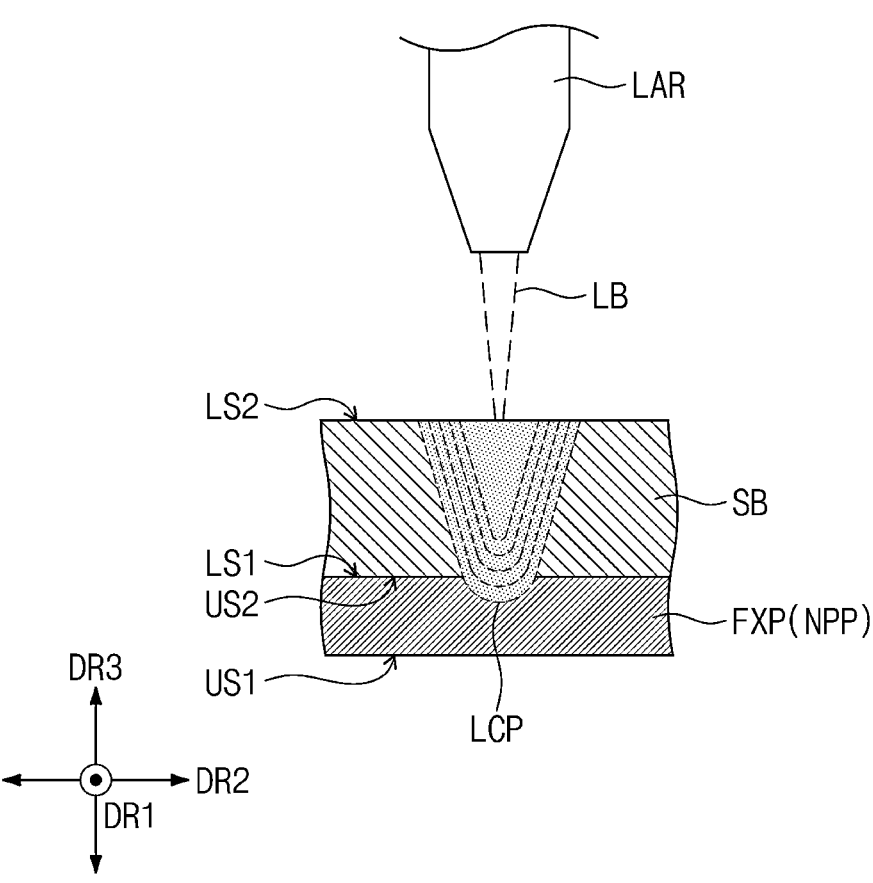
FIG. 19 is a sectional view for explaining a method of forming one of lower connecting parts illustrated in FIG. 16, according to an embodiment.

FIG. 19 is a view for explaining a method of forming one of the lower connecting parts illustrated in FIG. 16, according to an embodiment.

In an embodiment, although a method of forming one lower connecting part LCP is illustrated as an example, the other lower connecting parts LCP may also be formed by the same method.

In an embodiment and referring to FIG. 19, the method of forming the lower connecting part LCP may be substantially the same as the method of forming the upper connecting part UCP. For example, a laser LAR may be disposed over the lower surface LS2 of the support bar SB, and a laser beam LB generated by the laser LAR may be applied toward the lower surface LS2 of the support bar SB.

In an embodiment, a portion of the support bar SB may be gradually melted from the lower surface LS2 of the support bar SB by heat of the laser beam LB. The portion of the support bar SB and a portion of the flexible part FXP may be gradually melted from the lower surface LS2 of the support bar SB toward the upper surface US1 of the flexible part FXP.

In an embodiment, the laser LAR may be removed before the portion of the flexible part FXP is melted up to the upper surface US1 of the flexible part FXP, and thus the flexible part FXP may not be melted up to the upper surface US1 of the flexible part FXP. The portion of the support bar SB and the portion of the flexible part FXP may be melted to form the lower connecting part LCP. Accordingly, the lower connecting part LCP may be integrally formed with the support bar SB and the flexible part FXP.

In an embodiment, the lower surface LS2 of the support bar SB, to which the laser beam LB is applied first and which is heated for the longest period of time, may be most extensively melted, and since the heating time is decreased from the lower surface LS2 of the support bar SB toward the upper surface US1 of the flexible part FXP, the amount of molten material may be decreased from the lower surface LS2 of the support bar SB toward the upper surface US1 of the flexible part FXP. Accordingly, the lower connecting part LCP in FIG. 19 may have a decreasing width from the lower surface LS2 of the support bar SB toward the upper surface US1 of the flexible part FXP.

In an embodiment, since the lower connecting part LCP is formed by applying the laser beam LB to the support bar SB which is thicker than the flexible part FXP, more time may be required to melt the support bar SB, and the support bar SB may be further melted. Accordingly, the lower connecting part LCP may be formed to be larger than the upper connecting part UCP.

In an embodiment, the process of forming the lower connecting part LCP may be performed before the display module DM is attached to the upper surface of the support plate SPT.

In an embodiment, although not illustrated, the laser LAR in FIG. 19 may be disposed to be perpendicular to or inclined with respect to the lower surface LS2 of the support bar SB as described above with reference to FIGS. 17A to 18B. Accordingly, the focus of the laser beam LB may have a circular or oval shape on the lower surface LS2 of the support bar SB, and thus the lower connecting part LCP formed by the laser beam LB may have a circular or oval shape when viewed from above the plane.

In an embodiment, the support bar SB and the flexible part FXP may be connected by the upper connecting parts UCP and the lower connecting parts LCP formed by melting the flexible part FXP and the support bar SB according to the above-described processes.

In an embodiment, a resin or an adhesive tape may be used to connect the support bar SB to the flexible part FXP. The resin may be applied to the upper surface US2 of the support bar SB, and the flexible part FXP may be attached to the upper surface US2 of the support bar SB by the resin.

In an embodiment, when the resin is applied to the support bar SB, it may be difficult to apply the resin to a uniform thickness. Therefore, the degree of flatness of the resin may be low. In this case, the surface quality of the support plate SPT and the display module DM disposed on the support bar SB may be lowered.

In an embodiment, the adhesive tape may be attached to the support bar SB, and the flexible part FXP may be attached to the upper surface of the support bar SB by the adhesive tape. Since the adhesive tape has a uniform thickness, the adhesive tape may have a higher degree of flatness than the resin. However, the adhesive force of the adhesive tape may be less than that of the resin. Therefore, the flexible part FXP may be separated from the support bar SB.

In an embodiment and referring to FIGS. 16 to 19, the support bars SB and the flexible part FXP may be more firmly connected by the upper connecting parts UCP and the lower connecting parts LCP formed by melting the flexible part FXP and the support bars SB. The upper connecting parts UCP and the lower connecting parts LCP may be alternately disposed at the top and the bottom of the flexible part FXP and the support bars SB to connect the flexible part FXP and the support bars SB.

In an embodiment, when the upper connecting parts UCP and the lower connecting parts LCP are alternately arranged, the flexible part FXP and the support bars SB may be more firmly connected than when only the upper connecting parts UCP or only the lower connecting parts LCP are used.

In an embodiment, since the resin is not used, the above-described surface quality may not be deteriorated in the invention. In addition, since the upper and lower connecting parts UCP and LCP formed by melting the flexible part FXP and the support bars SB are used, the flexible part FXP and the support bars SB may be firmly connected, as compared with when the adhesive tape is used.

Figure 20A:
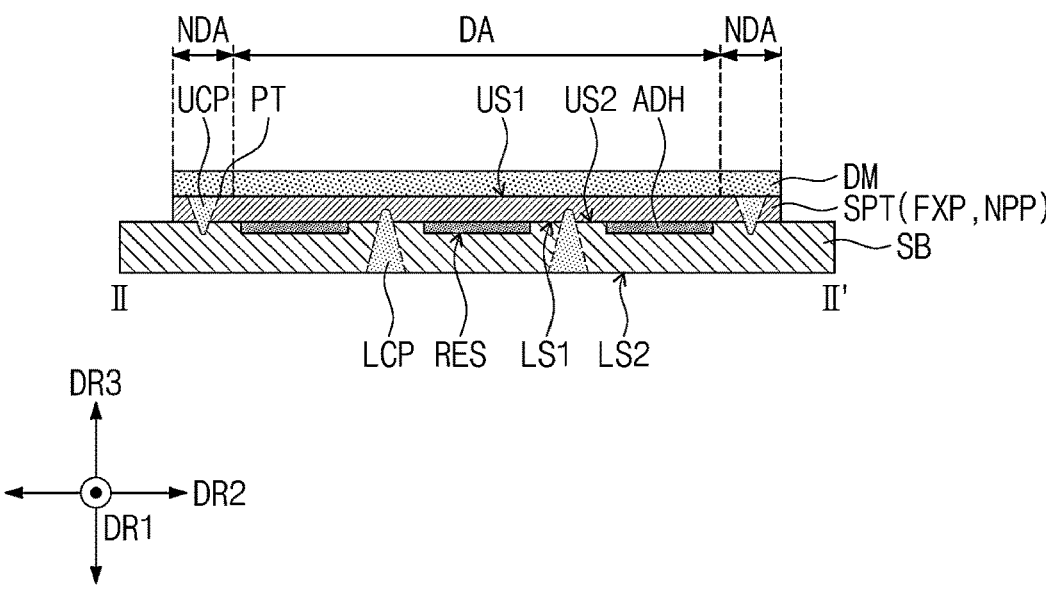
FIG. 20A is a sectional view illustrating a connection configuration between the flexible part and the support bar, according to an embodiment.
Figure 20B:
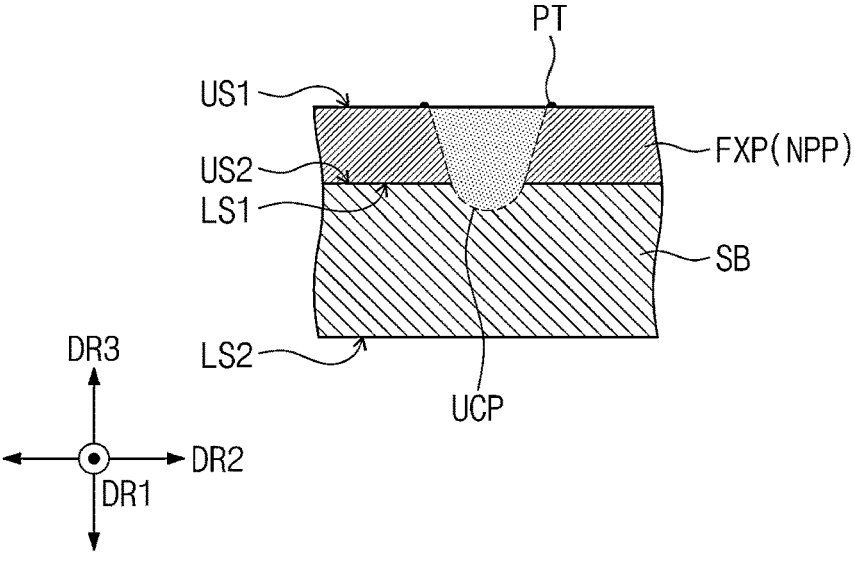
FIG. 20B is an enlarged sectional view of one of upper connecting parts illustrated in FIG. 20A, according to an embodiment.

FIG. 20A is a view illustrating a connection configuration between the flexible part and the support bar, according to an embodiment. FIG. 20B is an enlarged view of one of upper connecting parts UCP illustrated in FIG. 20A, according to an embodiment.

FIG. 20A is a sectional view corresponding to FIG. 16. Hereinafter, the configuration illustrated in FIG. 20A will be described focusing on the difference from the configuration illustrated in FIG. 16.

In an embodiment and referring to FIG. 20A, the upper connecting parts UCP may be disposed adjacent to the opposite sides of the support bar SB to be disposed opposite to each other in the second direction DR2. When viewed from above the plane, the upper connecting parts UCP may overlap the non-display region NDA without overlapping the display region DA. Accordingly, the upper connecting parts UCP may not be disposed under the display region DA and may be disposed only under the non-display region NDA.

In an embodiment, lower connecting parts LCP may be disposed between the upper connecting parts UCP. When viewed from above the plane, the lower connecting parts LCP may overlap the display region DA and may not overlap the non-display region NDA. Accordingly, the lower connecting parts LCP may be disposed only under the display region DA and may not be disposed under the non-display region NDA.

In an embodiment, a plurality of depressions RES may be defined on the upper surface US2 of the support bar SB. A plurality of adhesive layers ADH may be disposed in the depressions RES, respectively. The adhesive layers ADH may include a resin or an adhesive tape.

In an embodiment, when viewed from above the plane, the adhesive layers ADH may overlap the display region DA and may not overlap the non-display region NDA. Accordingly, the adhesive layers ADH may be disposed only under the display region DA and may not be disposed under the non-display region NDA.

In an embodiment, the adhesive layers ADH may be disposed between the upper and lower connecting parts UCP and LCP and between the lower connecting parts LCP. The flexible part FXP and the support bar SB may be connected with each other by the upper and lower connecting parts UCP and LCP and the adhesive layers ADH.

In an embodiment, when viewed from above the plane, each of the adhesive layers ADH may have a larger area than the upper and lower connecting parts UCP and LCP and may be provided on the support bar SB. Each of the adhesive layers ADH may be provided on the support bar SB with a larger area to supplement the coupling force between the flexible part FXP and the support bar SB. Accordingly, the flexible part FXP and the support bar SB may be more firmly connected with each other by the adhesive layers ADH as well as the upper and lower connecting parts UCP and LCP.

In an embodiment and referring to FIG. 20B, when the upper connecting part UCP is formed, a portion of the molten flexible part FXP may protrude upward so as to be disposed adjacent to the upper connecting part UCP.

In an embodiment and referring to FIGS. 20A and 20B, when protrusions PT formed adjacent to the upper connecting parts UCP are disposed to overlap the display region DA, the protrusions PT may be visible from above the display region DA, and therefore the display quality of the display module DM may be deteriorated. That is, a defective image may be generated due to the protrusions PT.

In an embodiment, the upper connecting parts UCP may be disposed only under the non-display region NDA such that the protrusions PT overlap only the non-display region NDA when viewed from above the plane. Since the non-display region NDA does not display an image, a defective image caused by the protrusions PT may not be visible from the outside.

FIGS. 21 to 25 are sectional views illustrating connection configurations between the flexible part and the support bar, according to various embodiments.

FIGS. 21 to 25 are sectional views corresponding to FIG. 16. Hereinafter, the configurations illustrated in FIGS. 21 to 25 will be described focusing on the differences from the configurations illustrated in FIGS. 16 and 20A.

Figure 21:
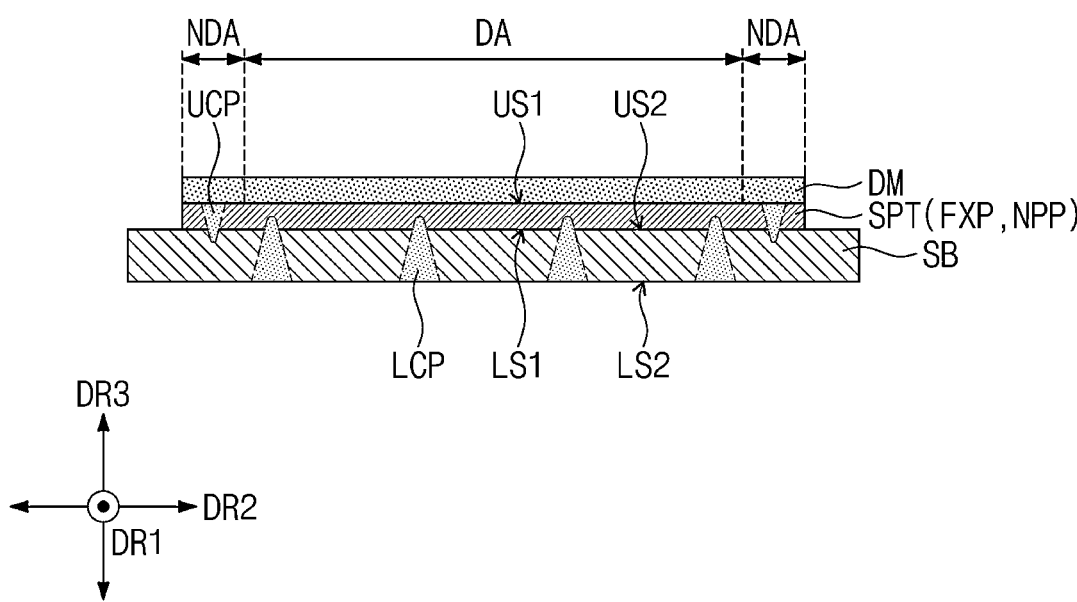
FIG. 21 is a sectional view illustrating connection configurations between the flexible part and the support bar, according to an embodiment.

In an embodiment and referring to FIG. 21, upper connecting parts UCP may be disposed adjacent to the opposite sides of the support bar SB to be disposed opposite to each other in the second direction DR2. When viewed from above the plane, the upper connecting parts UCP may not overlap the display region DA and may overlap the non-display region NDA.

In an embodiment, lower connecting parts LCP may be disposed between the upper connecting parts UCP. When viewed from above the plane, the lower connecting parts LCP may overlap the display region DA and may not overlap the non-display region NDA.

Figure 22:
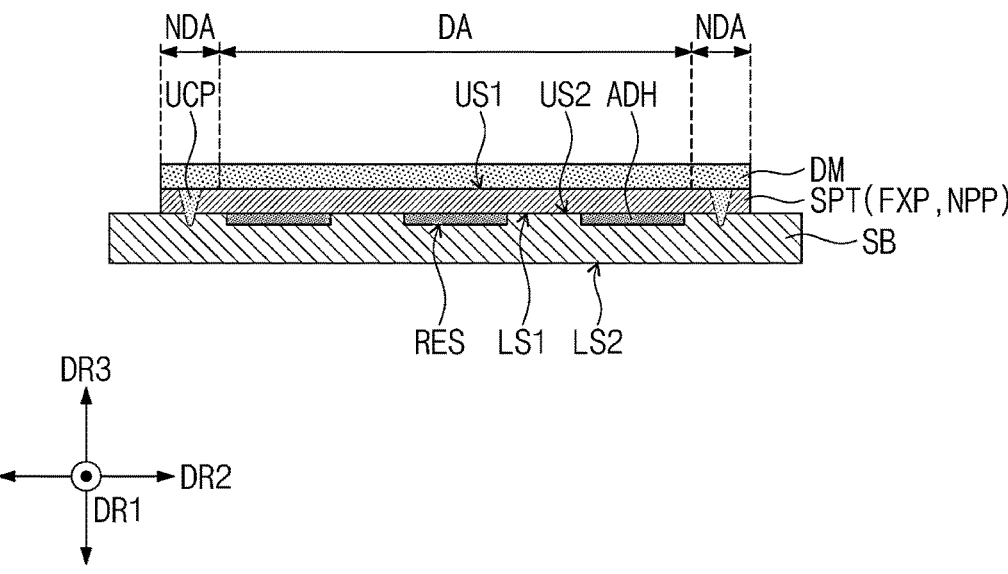
FIG. 22 is a sectional view illustrating connection configurations between the flexible part and the support bar, according to an embodiment.

In an embodiment and referring to FIG. 22, upper connecting parts UCP may be disposed adjacent to the opposite sides of the support bar SB to be disposed opposite to each other in the second direction DR2. When viewed from above the plane, the upper connecting parts UCP may not overlap the display region DA and may overlap the non-display region NDA.

In an embodiment, adhesive layers ADH may be disposed in depressions RES defined on the upper surface US2 of the support bar SB. When viewed from above the plane, the adhesive layers ADH may overlap the display region DA and may not overlap the non-display region NDA.

Figure 23:
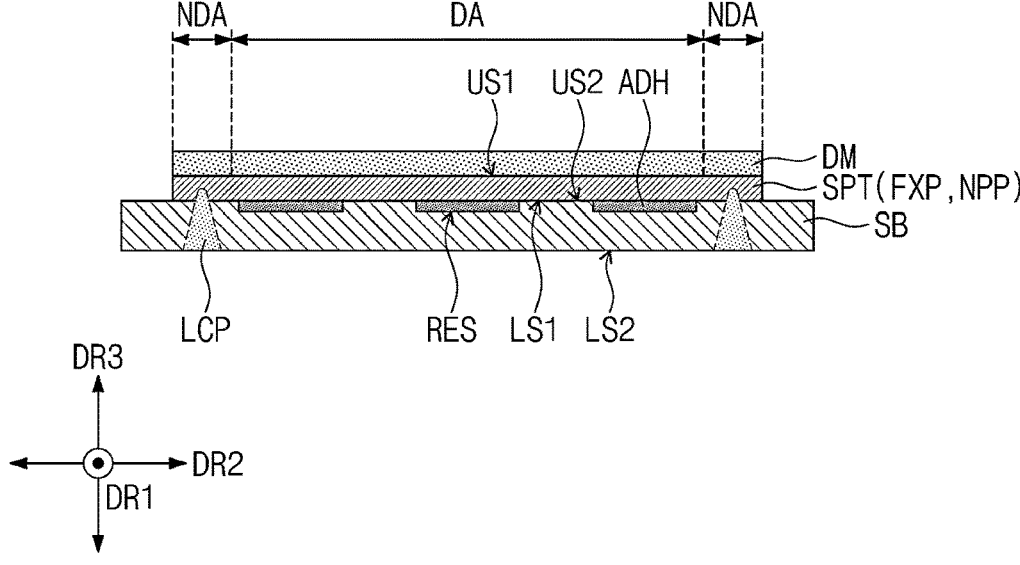
FIG. 23 is a sectional view illustrating connection configurations between the flexible part and the support bar, according to an embodiment.

In an embodiment and referring to FIG. 23, lower connecting parts LCP may be disposed adjacent to the opposite sides of the support bar SB to be disposed opposite to each other in the second direction DR2. When viewed from above the plane, the lower connecting parts LCP may not overlap the display region DA and may overlap the non-display region NDA.

In an embodiment, adhesive layers ADH may be disposed in depressions RES defined on the upper surface US2 of the support bar SB. When viewed from above the plane, the adhesive layers ADH may overlap the display region DA and may not overlap the non-display region NDA.

Figure 24:
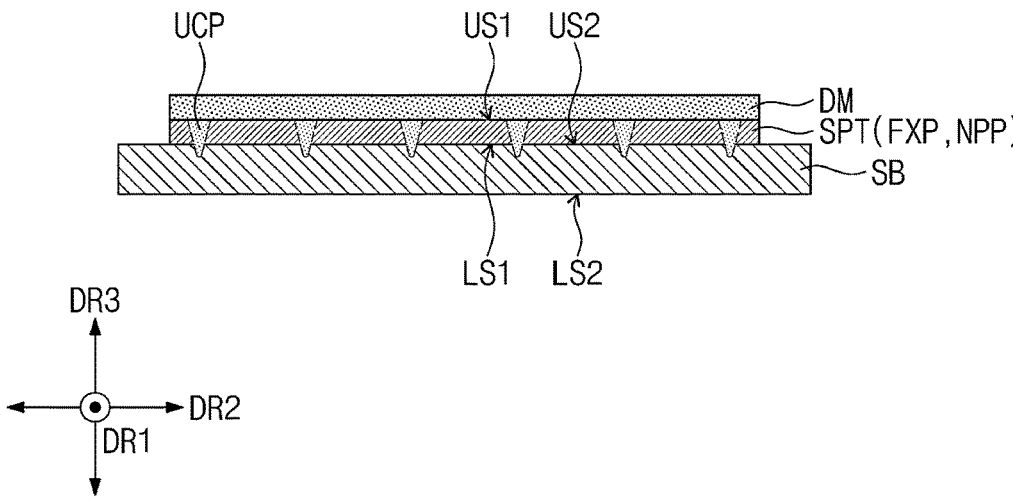
FIG. 24 is a sectional view illustrating connection configurations between the flexible part and the support bar, according to an embodiment.

In an embodiment and referring to FIG. 24, lower connecting parts LCP may not be used, and upper connecting parts UCP may be used to connect the flexible part FXP and the support bar SB. The upper connecting parts UCP may be arranged in the second direction DR2.

Figure 25:
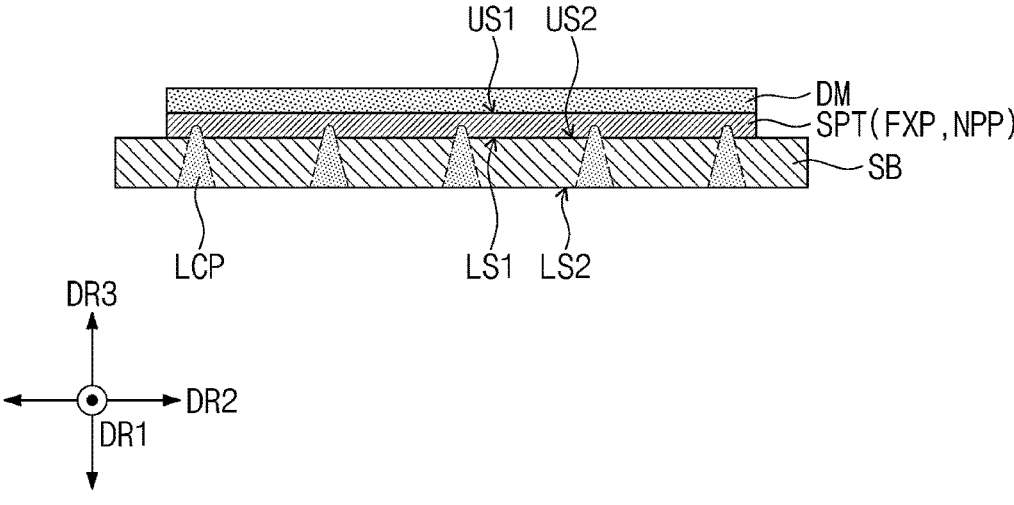
FIG. 25 is a sectional view illustrating connection configurations between the flexible part and the support bar, according to an embodiment.

In an embodiment and referring to FIG. 25, upper connecting parts UCP may not be used, and lower connecting parts LCP may be used to connect the flexible part FXP and the support bar SB. The lower connecting parts LCP may be arranged in the second direction DR2.

Figure 26:
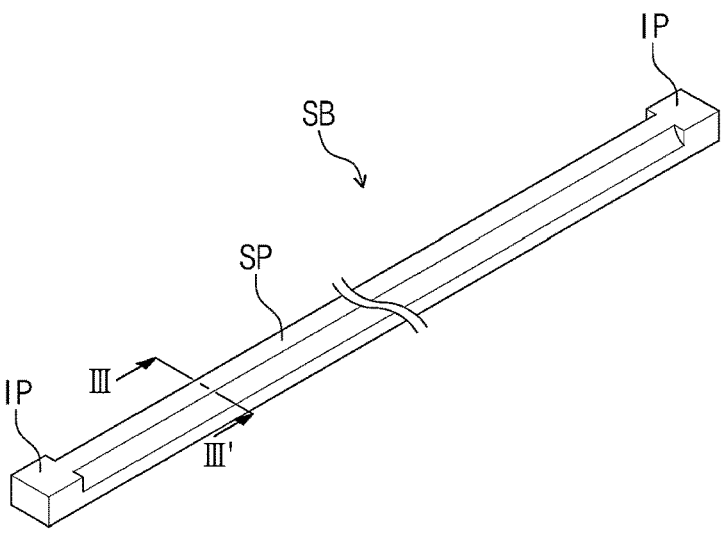
FIG. 26 is an enlarged perspective view of one of the support bars illustrated in FIG. 11, according to an embodiment.
Figure 26:
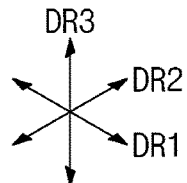
Figure 27:
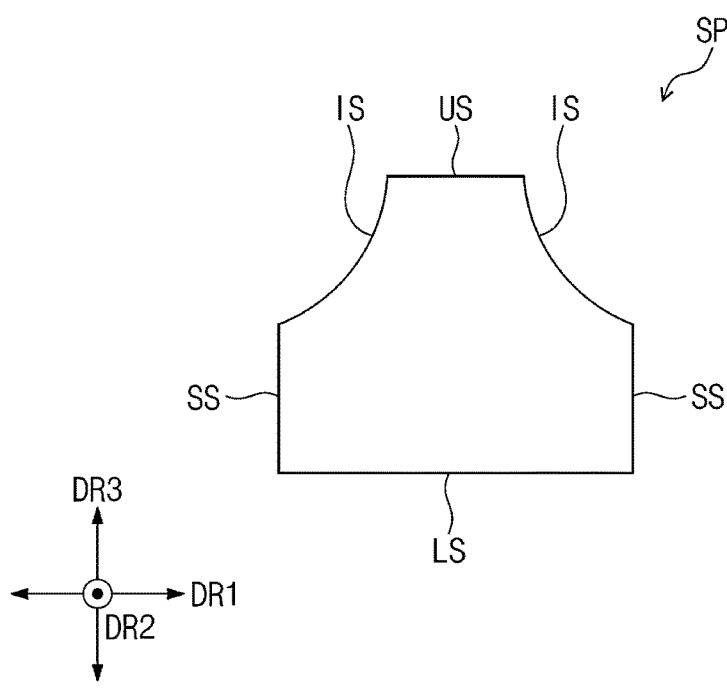
FIG. 27 is a sectional view taken along line III-III' illustrated in FIG. 26, according to an embodiment.

FIG. 26 is an enlarged view of one of the support bars illustrated in FIG. 11, according to an embodiment. FIG. 27 is a sectional view taken along line III-III' illustrated in FIG. 26, according to an embodiment.

In an embodiment and referring to FIG. 26, the support bar SB may include a support part SP extending in the second direction DR2 and inserts IP extending in the second direction DR2 from opposite sides of the support part SP to be disposed opposite to each other in the second direction DR2.

In an embodiment and referring to FIGS. 26 and 27, the support part SP may include an upper surface US, a lower surface LS, two side surfaces SS, and two inclined surfaces IS. The upper surface US may be disposed over the lower surface LS, and the upper surface US and the lower surface LS may extend in the first direction DR1 and may be disposed parallel to each other. The upper surface US may have a smaller width in the first direction DR1 than the lower surface LS.

In an embodiment, the side surfaces SS may extend in the third direction DR3 from opposite sides of the lower surface LS opposite to each other in the first direction DR1. The side surfaces SS may extend upward from the lower surface LS.

In an embodiment, the inclined surfaces IS may extend from the upper ends of the side surfaces SS from opposite sides of the upper surface US opposite to each other in the first direction DR1. In addition, the inclined surfaces IS may extend from the upper ends of the side surfaces SS toward the opposite sides of the upper surface US. For example, the inclined surfaces IS may have a concave curve shape. However, without being limited thereto, in another embodiment, the inclined surfaces IS may have a straight-line shape.

In an embodiment and referring to FIG. 26, the inserts IP may have a quadrangular shape when viewed in the first direction DR1 and the second direction DR2. That is, the inserts IP may have a rectangular parallelepiped shape.

Figure 28:
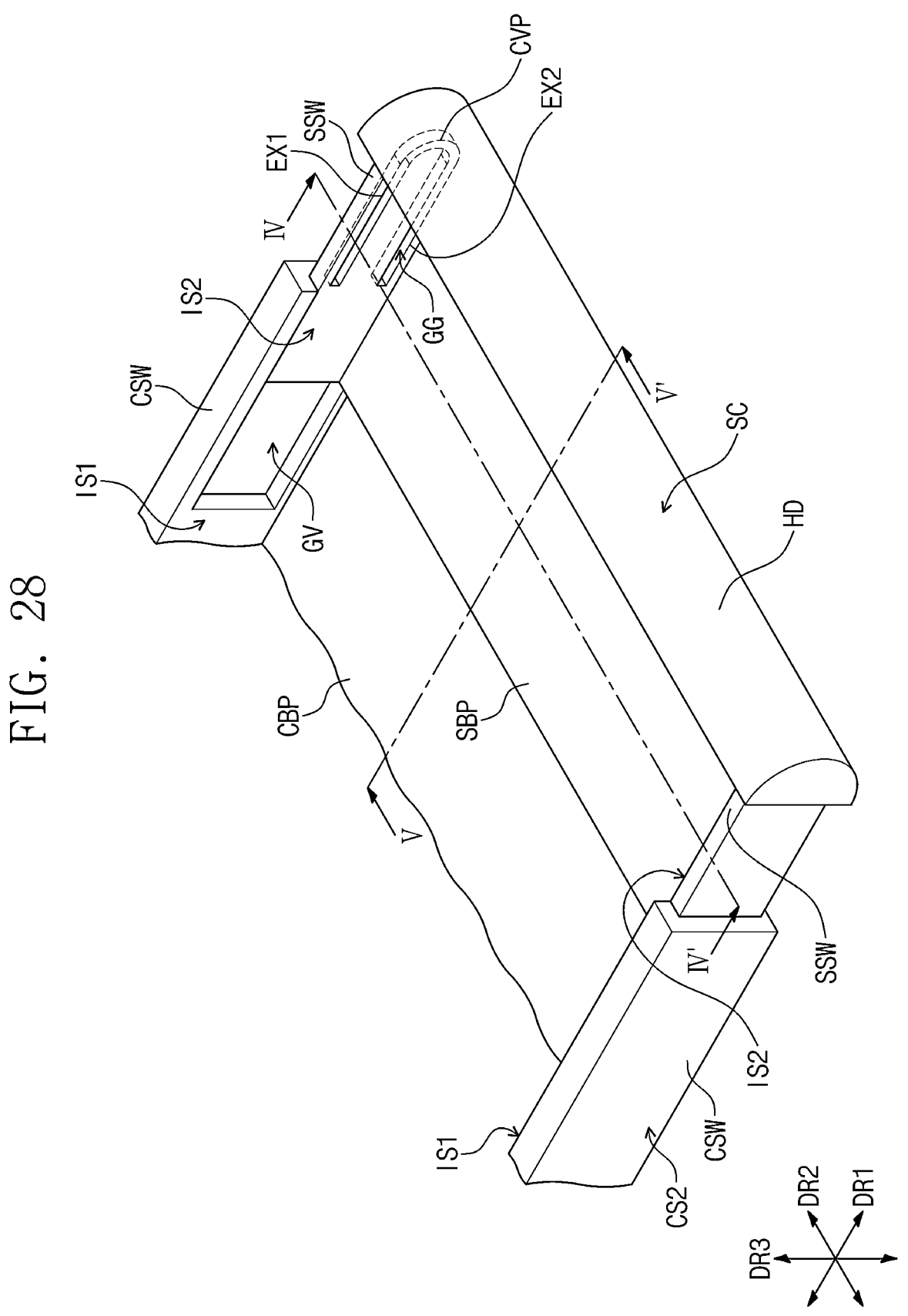
FIG. 28 is an internal perspective view illustrating a sliding case and a portion of a second case disposed adjacent to the sliding case illustrated in FIG. 3, according to an embodiment.

FIG. 28 is an internal perspective view illustrating the sliding case and a portion of the second case adjacent to the sliding case illustrated in FIG. 3, according to an embodiment.

In an embodiment and referring to FIG. 28, the second case CS2 may include a bottom part CBP and sidewall parts CSW. The bottom part CBP may have a plane defined by the first and second directions DR1 and DR2. The sidewall parts CSW may extend upward (e.g., in the third direction DR3) from opposite sides of the bottom part CBP to be disposed opposite to each other in the second direction DR2. The sidewall parts CSW may extend longer in the first direction DR1 than in the third direction DR3.

In an embodiment, grooves GV may be defined on inner surfaces IS1 of the sidewall parts CSW to be disposed opposite to each other in the second direction DR2. The grooves GV may extend in the first direction DR1. Although one groove GV is illustrated due to the observation position of the perspective view, two grooves GV may be defined on the two inner surfaces IS1, respectively.

In an embodiment, the sliding case SC may be coupled to the second case CS2 so as to slide relative to the second case CS2 in the first direction DR1. The sliding case SC may reciprocate relative to the second case CS2 in the first direction DR1. The sliding case SC may be disposed in the grooves GV and may reciprocate in the first direction DR1 along the grooves GV.

In an embodiment, the sliding case SC may include a bottom part SBP, sidewall parts SSW, and a head part HD. The bottom part SBP may have a plane defined by the first and second directions DR1 and DR2. The bottom part SBP may be disposed on the bottom part CBP of the second case CS2.

In an embodiment, the sidewall parts SSW may extend upward (e.g., in the third direction DR3) from opposite sides of the bottom part SBP to be disposed opposite to each other in the second direction DR2. The sidewall parts SSW may extend longer in the first direction DR1 than in the third direction DR3.

In an embodiment, the sidewall parts SSW may be disposed in the grooves GV, and the sliding case SC may be coupled to the second case CS2 accordingly. The sidewall parts SSW may reciprocate in the first direction DR1 along the grooves GV.

In an embodiment, the head part HD may be defined as a handle and may be connected to the sidewall parts SSW. The head part HD may be connected to second sides of the sidewall parts SSW disposed opposite to the first sides of the sidewall parts SSW inserted into the grooves GV. In addition, the head part HD may be connected to the bottom part SBP. The user may manipulate the head part HD to move the sliding case SC in the first direction DR1.

In an embodiment, guide grooves GG may be defined on inner surfaces IS2 of the sidewall parts SSW disposed opposite to each other in the second direction DR2. The guide grooves GG may have the shape of "U". For example, the guide grooves GG may have a shape obtained by rotating the shape of "U" by 90 degrees in the counterclockwise direction. Although one guide groove GG is illustrated due to the observation position of the perspective view, two guide grooves GG may be defined on the two inner surfaces IS2, respectively.

In an embodiment, each of the guide grooves GG may include a first extension EX1 extending in the first direction DR1, a second extension EX2 that is disposed under the first extension EX1 and that extends in the first direction DR1, and a curved portion CVP extending from an end of the first extension EX1 to an end of the second extension EX2 and having a curved shape. The curved portion CVP may be curved toward the head part HD. For example, the curved portion CVP of the guide groove GG hidden by the head part HD is illustrated by dotted lines.

Figure 29:
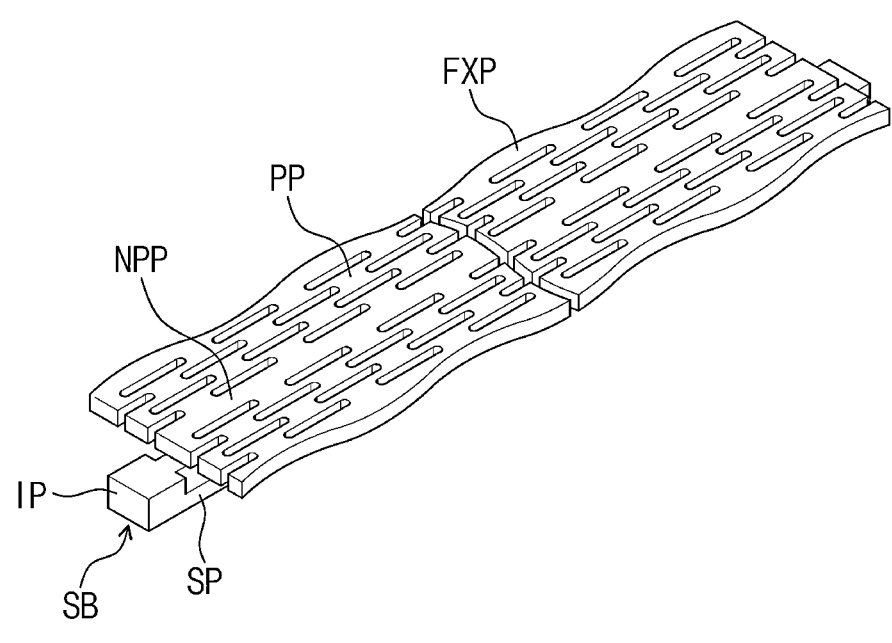
FIG. 29 is a perspective view illustrating one support bar and a portion of the flexible part disposed on the one support bar illustrated in FIG. 11, according to an embodiment.
Figure 29:
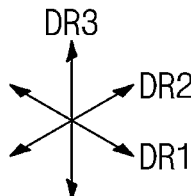

FIG. 29 is a perspective view illustrating one support bar and a portion of the flexible part disposed on the one support bar illustrated in FIG. 11, according to an embodiment.

In an embodiment and referring to FIG. 29, when the support bar SB is connected to the flexible part FXP, the support part SP may be connected to the non-pattern part NPP, and the inserts IP may be exposed outside the flexible part FXP. The inserts IP may be inserted into the guide grooves GG illustrated in FIG. 28. Since the inserts IP are inserted into the guide grooves GG, the support bars SB may be coupled to the sliding case SC. The inserts IP may move along the guide grooves GG, and the support bars SB may move along the guide grooves GG accordingly.

Figure 30:
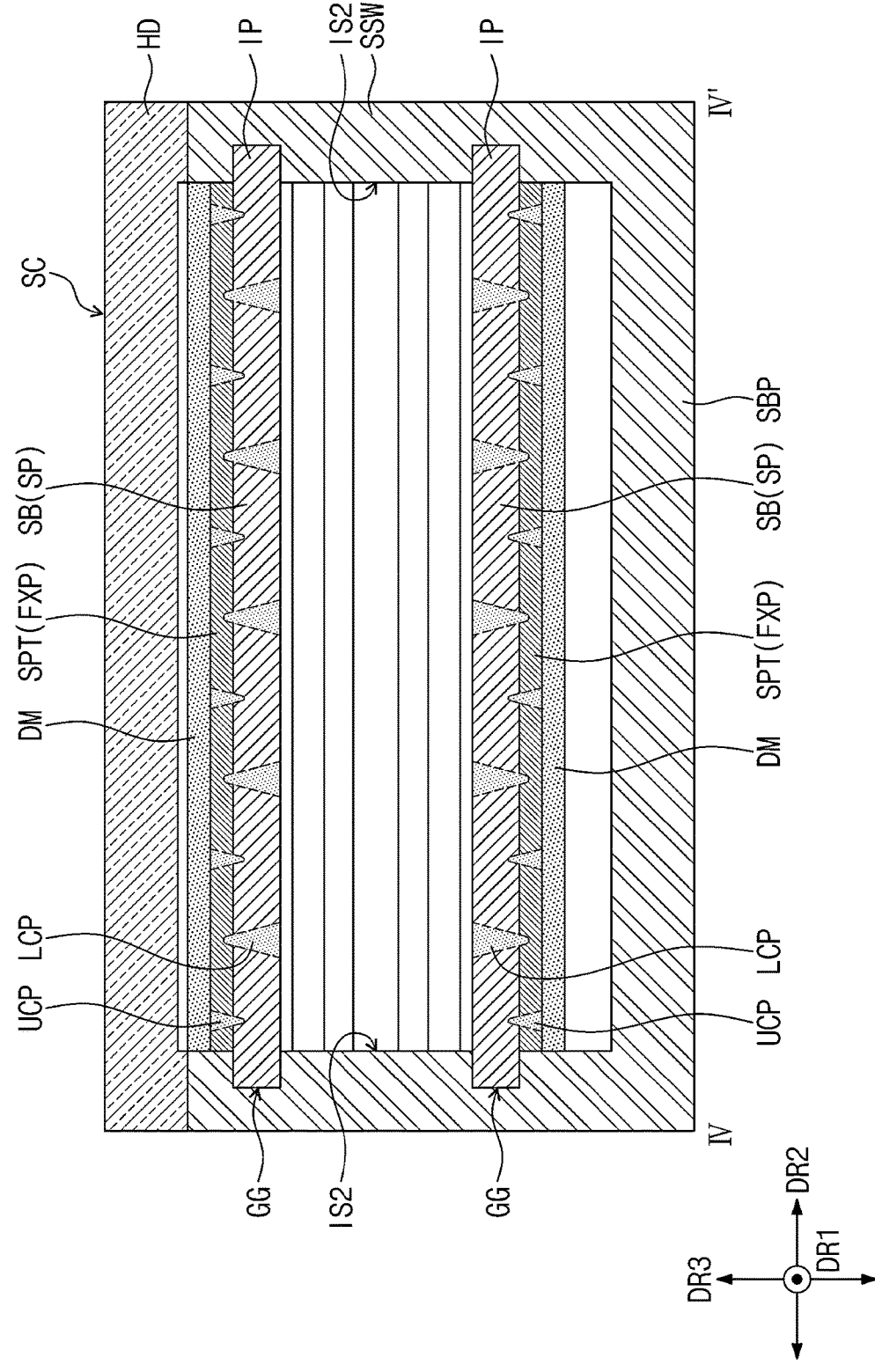
FIG. 30 is a sectional view taken along line IV-IV' illustrated in FIG. 28, according to an embodiment.

FIG. 30 is a sectional view taken along line IV-IV' illustrated in FIG. 28, according to an embodiment.

In an embodiment and referring to FIG. 30, the display module DM, the support plate SPT, and the support bars SB coupled to the sliding case SC are illustrated together with the sliding case SC.

In an embodiment and referring to FIG. 30, the opposite sides of the support bars SB disposed opposite to each other in the second direction DR2 may be inserted into the guide grooves GG. For example, the inserts IP of the support bars SB may be inserted into the guide grooves GG. Accordingly, the support bars SB may be coupled to the sliding case SC.

In an embodiment, the support bars SB may be connected to the flexible part FXP of the support plate SPT by the upper connecting parts UCP and the lower connecting parts LCP. For example, the support parts SP of the support bars SB may be connected to the flexible part FXP by the upper and lower connecting parts UCP and LCP. The support bars SB and the flexible part FXP may support the display module DM.

Figures 31, 32:
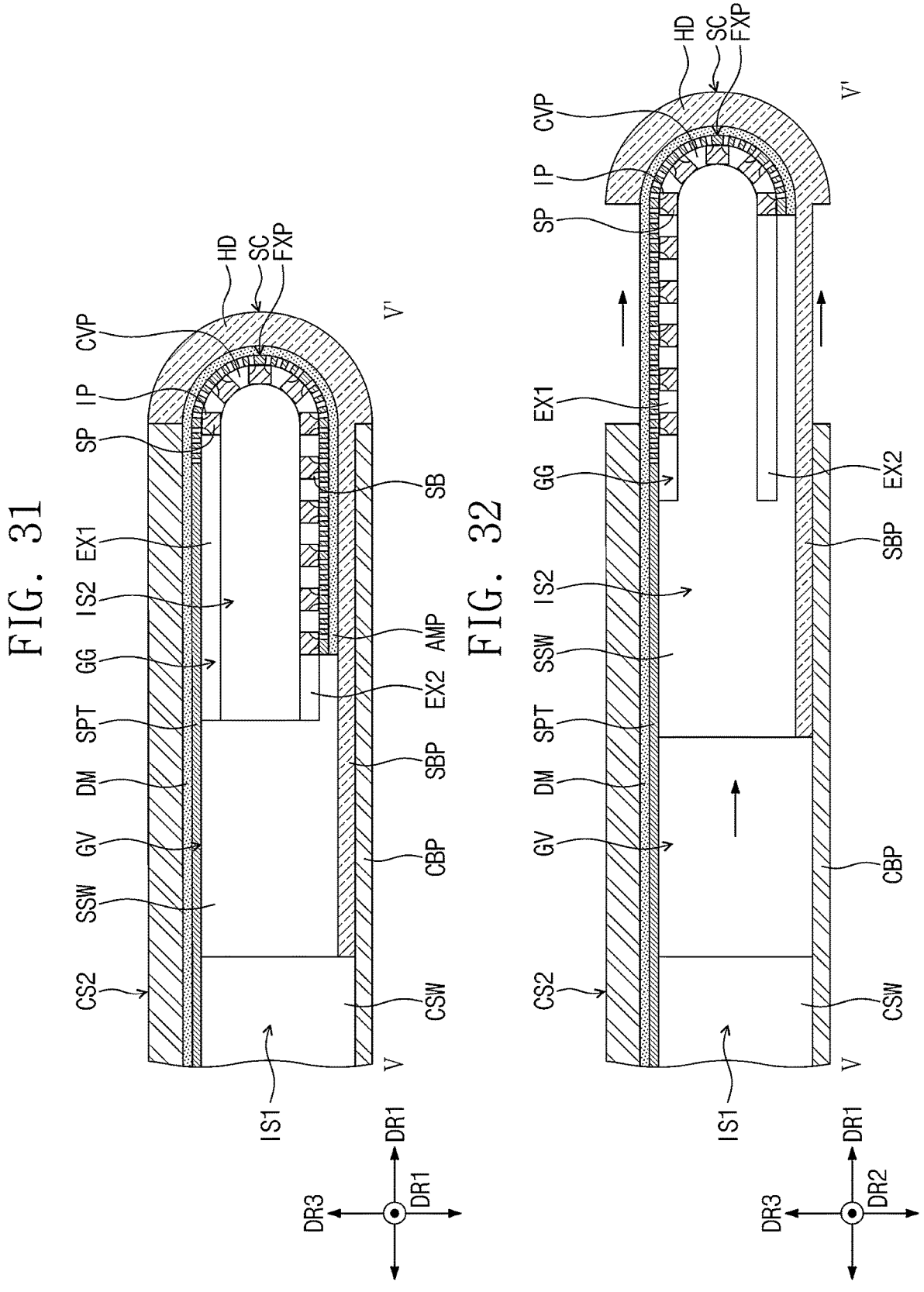
FIG. 31 is a sectional view taken along line V-V' illustrated in FIG. 28, according to an embodiment.
FIG. 32 is a sectional view taken along line V-V' illustrated in FIG. 28, according to an embodiment.

FIGS. 31 and 32 are sectional views taken along line V-V' illustrated in FIG. 28, according to an embodiment.

FIG. 31 is a sectional view corresponding to the default mode illustrated in FIG. 1, according to an embodiment, and FIG. 32 is a sectional view corresponding to the extended mode illustrated in FIG. 3, according to an embodiment.

In an embodiment and referring to FIGS. 31 and 32, the display module DM, the support plate SPT, and the support bars SB coupled to the sliding case SC are illustrated together with the sliding case SC.

In an embodiment and referring to FIGS. 1 and 31, the display module DM and the support plate SPT may be bent in the shape of "U" on one side of the display device DD and may be accommodated in the sliding case SC. The accommodated part AMP of the display module DM may be disposed under the second extension EX2.

In an embodiment, the support bars SB may be disposed in the guide groove GG. Specifically, the inserts IP of the support bars SB may be inserted into the guide groove GG. The support bars SB may be arranged along the guide groove GG having the shape of a "U". The support bars SB may be mainly disposed in the curved portion CVP and the second extension EX2 of the guide groove GG. Some of the support bars SB may be disposed in the first extension EX1. In the default mode, more support bars SB may be disposed in the second extension EX2.

In an embodiment, in the default mode, the sliding case SC may be entirely disposed in the groove GV in the second case CS2. In the default mode, the head part HD may be disposed to make contact with one side of the second case CS2.

In an embodiment and referring to FIGS. 3 and 32, in the extended mode, the sliding case SC may move away from the second case CS2 in the first direction DR1. Accordingly, the display module DM may be extended to the outside. The sidewall part SSW of the sliding case SC may move in the first direction DR1 along the groove GV. The head part HD may move away from the second case CS2 in the first direction DR1.

In an embodiment, when the sliding case SC moves in the first direction DR1, the support bars SB may move along the guide groove GG. A portion of the support plate SPT (e.g., a portion of the flat part) disposed in the second case CS2 may be connected and fixed to the second case CS2. The flexible part FXP disposed in the sliding case SC may not be connected to the sliding case SC. Accordingly, the flexible part FXP may move together with the support bars SB.

In an embodiment, in the extended mode, the number of support bars SB disposed in the first extension EX1 may be greater than the number of support bars SB disposed in the second extension EX2. In the extended mode, the support bars SB disposed in the first extension EX1 may support the flexible part FXP. The support bars SB disposed in the first extension EX1 may supplement the support force of the flexible part FXP and may support the display module DM such that the display module DM is flat.

In an embodiment, since the area of the display module DM exposed to the outside in the extended mode is expanded, the area of the display surface DS exposed to the outside may be expanded. When the display device DD is switched from the extended mode to the default mode, the head part HD may move toward the second case CS2 in the first direction DR1. Accordingly, the default mode illustrated in FIG. 31 may be performed.

Figure 33:
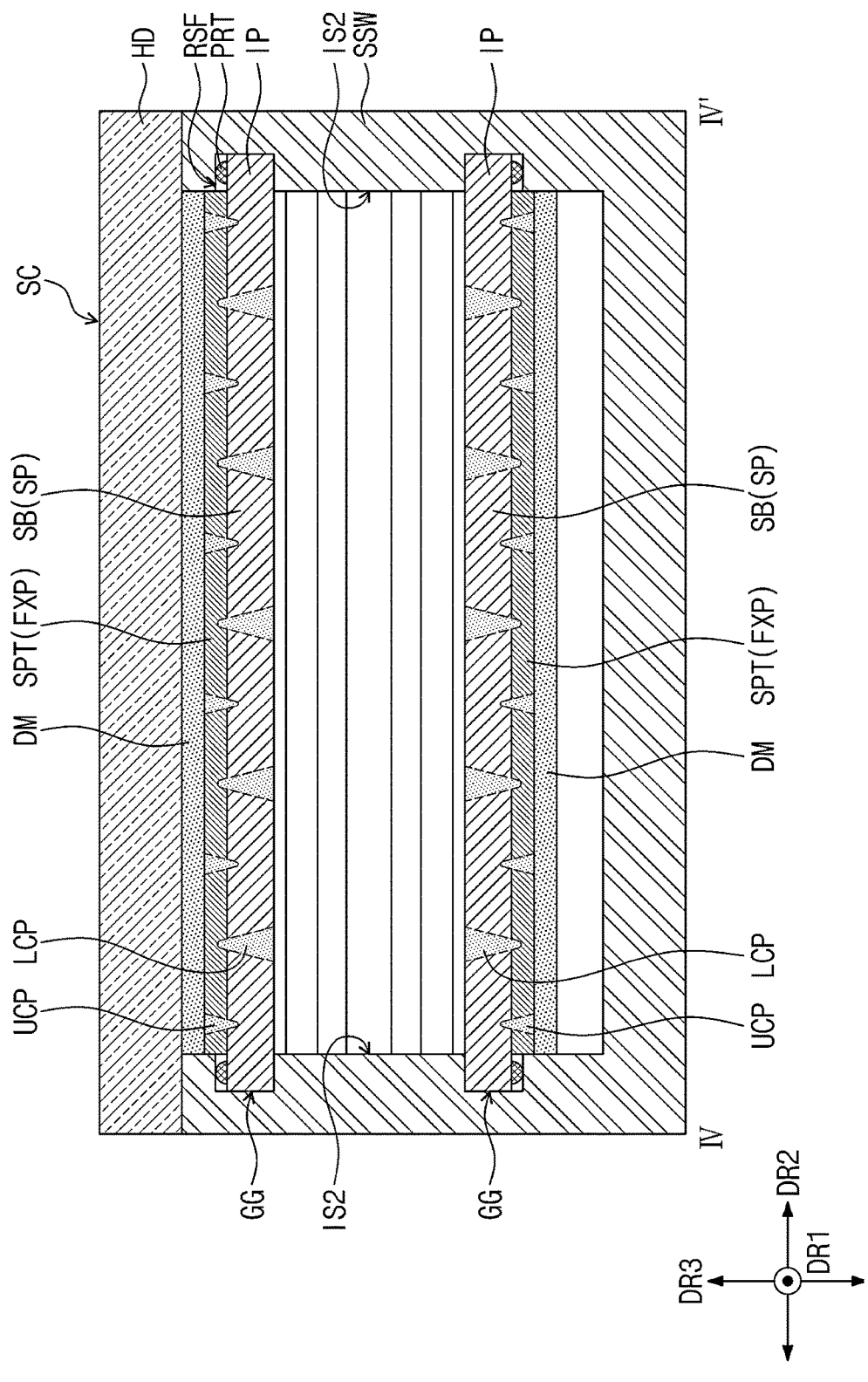
FIG. 33 is a sectional view illustrating the configuration of support bars, according to an embodiment.

FIG. 33 is a view illustrating a configuration of support bars, according to an embodiment.

In an embodiment and referring to FIG. 33, a sectional view corresponding to FIG. 30 is illustrated. Hereinafter, the configuration of the support bars illustrated in FIG. 33 will be described focusing on the difference from the configuration of the support bars illustrated in FIG. 30.

In an embodiment and referring to FIG. 33, each of the support bars SB may include protrusions PRT disposed on inserts IP. The protrusions PRT may protrude from the inserts IP in a semicircular shape. The protrusions PRT may be disposed in the guide grooves GG together with the inserts IP.

In an embodiment and as illustrated in FIG. 30, the inserts IP within the guide grooves GG may make surface-to-surface contact with recessed surfaces (reference numeral not illustrated in FIG. 30) that define the guide grooves GG. However, in FIG. 33, the protrusions PRT having the semicircular shape may make point contact with the recessed surfaces RSF that define the guide grooves GG. A frictional force may be proportional to a contact area. Accordingly, in FIG. 33, the frictional force of the protrusions PRT against the recessed surfaces RSF may be reduced.

According to the embodiments of the invention, the support plate SPT and the support bars SB may be more firmly connected with each other by the upper connecting parts UCP and the lower connecting parts LCP formed by melting the portions of the support plate SPT and the portions of the support bars SB using the laser LAR.

While the invention has been described with reference to embodiments thereof, it will be apparent to those of ordinary skill in the art that various changes and modifications may be made thereto without departing from the spirit and scope of the invention. Therefore, the scope of the invention is not limited to the contents described in the specification and figures. Moreover, embodiments or parts of the embodiments may be combined in whole or in part without departing from the scope of the invention.

What is claimed is:

1. A display device comprising:
   a display module;

a support plate disposed on a lower surface of the display module, the support plate including a flat part and a flexible part extending from the flat part in a first direction, wherein the flexible part is folded about a bending axis extending in a second direction crossing the first direction;
   a support bar disposed on a lower surface of the flexible part and extending in the second direction;
   an upper connecting part extending from an upper surface of the flexible part into the support bar through the flexible part; and
   a lower connecting part extending from a lower surface of the support bar into the flexible part through the support bar.

2. The display device of claim 1, wherein the upper connecting part is spaced apart from the lower surface of the support bar.

3. The display device of claim 1, wherein the lower connecting part is spaced apart from the upper surface of the flexible part.

4. The display device of claim 1, wherein the upper connecting part has a gradually decreasing width from the upper surface of the flexible part toward the lower surface of the support bar.

5. The display device of claim 1, wherein the lower connecting part has a gradually decreasing width from the lower surface of the support bar toward the upper surface of the flexible part.

6. The display device of claim 1, wherein the upper connecting part has a smaller size than the lower connecting part.

7. The display device of claim 1, wherein each of the upper connecting part and the lower connecting part is formed by melting a portion of the flexible part and a portion of the support bar using a laser beam.

8. The display device of claim 1, wherein the upper connecting part is integrally formed with the flexible part and the support bar.

9. The display device of claim 1, wherein the lower connecting part is integrally formed with the support bar and the flexible part.

10. The display device of claim 1, wherein the upper connecting part includes a plurality of upper connecting parts, and the lower connecting part includes a plurality of lower connecting parts, and
    wherein the plurality of upper connecting parts and the plurality of lower connecting part are alternately arranged along the second direction.

11. The display device of claim 1, wherein the upper connecting part includes a plurality of upper connecting parts, wherein the plurality of upper connecting parts are disposed adjacent to opposite sides of the support bars disposed opposite to each other in the second direction.

12. The display device of claim 11, wherein the display module includes:
    a display region; and
    a non-display region disposed around the display region,
    wherein when viewed from above a plane, the plurality of upper connecting parts overlap the non-display region and do not overlap the display region.

13. The display device of claim 12, wherein the lower connecting part includes a plurality of lower connecting parts, wherein the plurality of lower connecting parts are disposed between the upper connecting parts.

14. The display device of claim 13, wherein the lower connecting parts overlap the display region when viewed from above the plane.

15. The display device of claim 13, further comprising:

a plurality of adhesive layers disposed in depressions defined on an upper surface of the support bar.

16. The display device of claim 15, wherein the adhesive layers overlap the display region when viewed from above the plane.

17. The display device of claim 15, wherein the adhesive layers are disposed between the plurality of upper connecting parts and the plurality of lower connecting parts and between the plurality of lower connecting parts.

18. The display device of claim 1, further comprising:

a folding part in which a plurality of first openings are defined, wherein the flat part includes a first non-folding part and a second non-folding part arranged in the first direction, wherein the folding part is disposed between the first non-folding part and the second non-folding part, and wherein the flexible part extends from the second non-folding part in the first direction, and a plurality of second openings are defined in the flexible part.

19. A display device comprising:

a display module including a display region and a non-display region disposed around the display region;

a support plate disposed on a lower surface of the display module, the support plate including a flat part and a flexible part extending from the flat part;

a support bar disposed on a lower surface of the flexible part;

an upper connecting part which extends from an upper surface of the flexible part into the support bar through the flexible part and overlaps the non-display region when viewed from above a plane; and a lower connecting part which extends from a lower surface of the support bar into the flexible part through the support bar and overlaps the display region when viewed from above the plane.

20. A display device comprising:

a display module;

a support plate disposed on a lower surface of the display module, the support plate including a flat part and a flexible part extending from the flat part;

a support bar disposed on a lower surface of the flexible part;

an upper connecting part extending from an upper surface of the flexible part into the support bar through the flexible part;

a lower connecting part extending from a lower surface of the support bar into the flexible part through the support bar; and an adhesive layer disposed in a depression defined on an upper surface of the support bar between the upper connecting part and the lower connecting part.

* * * * *